US007291565B2

(12) United States Patent
Hansen et al.

(10) Patent No.: US 7,291,565 B2
(45) Date of Patent: Nov. 6, 2007

(54) METHOD AND SYSTEM FOR TREATING A SUBSTRATE WITH A HIGH PRESSURE FLUID USING FLUOROSILICIC ACID

(75) Inventors: Brandon Hansen, Mesa, AZ (US); Marie Lowe, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/906,353

(22) Filed: Feb. 15, 2005

(65) Prior Publication Data

US 2006/0180573 A1 Aug. 17, 2006

(51) Int. Cl.
*H01L 21/302* (2006.01)

(52) U.S. Cl. ......................... 438/745; 216/84; 134/1.3; 430/329

(58) Field of Classification Search ................ 438/745; 216/84; 430/329; 134/1.3
See application file for complete search history.

(56) References Cited

U.S. PATENT DOCUMENTS

| | | | | |
|---|---|---|---|---|
| 2,439,689 | A | 4/1948 | Hyde | 117/124 |
| 2,617,719 | A | 11/1952 | Stewart | 23/312 |
| 2,625,886 | A | 1/1953 | Browne | 103/150 |
| 3,642,020 | A | 2/1972 | Payne | 137/112 |
| 3,744,660 | A | 7/1973 | Gaines et al. | 220/10 |
| 3,890,176 | A | 6/1975 | Bolon | 156/2 |
| 3,900,551 | A | 8/1975 | Bardoncelli et al. | 423/9 |
| 3,968,885 | A | 7/1976 | Hassan et al. | 214/1 BC |
| 4,029,517 | A | 6/1977 | Rand | 134/11 |
| 4,091,643 | A | 5/1978 | Zucchini | 68/18 C |
| 4,219,333 | A | 8/1980 | Harris | 8/137 |
| 4,245,154 | A | 1/1981 | Uehara et al. | 250/227 |
| 4,341,592 | A | 7/1982 | Shortes et al. | 156/643 |
| 4,349,415 | A | 9/1982 | DeFilippi et al. | 204/14 |
| 4,355,937 | A | 10/1982 | Mack et al. | 414/217 |
| 4,367,140 | A | 1/1983 | Wilson | 210/110 |
| 4,406,596 | A | 9/1983 | Budde | 417/393 |
| 4,422,651 | A | 12/1983 | Platts | 277/206 R |
| 4,474,199 | A | 10/1984 | Blaudszun | 134/105 |
| 4,475,993 | A | 10/1984 | Blander et al. | 204/64 |
| 4,522,788 | A | 6/1985 | Sitek et al. | 422/78 |

(Continued)

FOREIGN PATENT DOCUMENTS

CH 251213 8/1948

(Continued)

OTHER PUBLICATIONS

J. B. Rubin et al., *A Comparison of Chilled DI Water/Ozone and $CO_2$-based Supercritical Fluids as Replacements for Photoresist-Stripping Solvents*, IEEE/CPMT Int'l Electronics Manufacturing Technology Symposium, pp. 308-314, 1998.

(Continued)

*Primary Examiner*—Nadine G. Norton
*Assistant Examiner*—Mahmoud Dahimene
(74) *Attorney, Agent, or Firm*—Wood, Herron & Evans, LLP

(57) ABSTRACT

A method and system is described for treating a substrate with a high pressure fluid, such as carbon dioxide in a supercritical state. A process chemistry is introduced to the high pressure fluid for treating the substrate surface. The process chemistry comprises fluorosilicic acid.

6 Claims, 5 Drawing Sheets

U.S. PATENT DOCUMENTS 4,549,467 A 10/1985 Wilden et al. ................ 91/307
4,592,306 A 6/1986 Gallego ...................... 118/719
4,601,181 A 7/1986 Privat ......................... 68/18 C
4,626,509 A 12/1986 Lyman ....................... 435/287
4,670,126 A 6/1987 Messer et al. ............. 204/298
4,682,937 A 7/1987 Credle, Jr. .................. 417/393
4,693,777 A 9/1987 Hazano et al. .............. 156/345
4,749,440 A 6/1988 Blackwood et al. ........ 156/646
4,778,356 A 10/1988 Hicks ......................... 417/397
4,788,043 A 11/1988 Kagiyama et al. .......... 422/292
4,789,077 A 12/1988 Noe ........................... 220/319
4,823,976 A 4/1989 White, III et al. .......... 220/211
4,825,808 A 5/1989 Takahashi et al. .......... 118/719
4,827,867 A 5/1989 Takei et al. ................... 118/64
4,838,476 A 6/1989 Rahn ....................... 228/180.1
4,865,061 A 9/1989 Fowler et al. .............. 134/108
4,877,530 A 10/1989 Moses ....................... 210/511
4,879,004 A 11/1989 Oesch et al. .................. 203/89
4,879,431 A 11/1989 Bertoncini .................. 435/311
4,917,556 A 4/1990 Stark et al. ................. 414/217
4,923,828 A 5/1990 Gluck et al. ................ 437/225
4,924,892 A 5/1990 Kiba et al. .................. 134/123
4,925,790 A 5/1990 Blanch et al. ................ 435/52
4,933,404 A 6/1990 Beckman et al. ........... 526/207
4,944,837 A 7/1990 Nishikawa et al. ......... 156/646
4,951,601 A 8/1990 Maydan et al. ............ 118/719
4,960,140 A 10/1990 Ishijima et al. ............... 134/31
4,983,223 A 1/1991 Gessner ..................... 134/25.4
5,011,542 A 4/1991 Weil ............................ 134/38
5,013,366 A 5/1991 Jackson et al. ................ 134/1
5,044,871 A 9/1991 Davis et al. ................ 414/786
5,062,770 A 11/1991 Story et al. ................... 417/46
5,068,040 A 11/1991 Jackson ...................... 210/748
5,071,485 A 12/1991 Matthews et al. ............. 134/2
5,091,207 A 2/1992 Tanaka .......................... 427/8
5,105,556 A 4/1992 Kurokawa et al. ............. 34/12
5,143,103 A 9/1992 Basso et al. ............... 134/98.1
5,158,704 A 10/1992 Fulton et al. ............... 252/309
5,167,716 A 12/1992 Boitnott et al. ............ 118/719
5,169,296 A 12/1992 Wilden ....................... 417/395
5,169,408 A 12/1992 Biggerstaff et al. ........ 29/25.01
5,174,917 A 12/1992 Monzyk ...................... 252/60
5,185,058 A 2/1993 Cathey, Jr. .................. 156/656
5,185,296 A 2/1993 Morita et al. ............... 437/229
5,186,594 A 2/1993 Toshima et al. ............ 414/217
5,186,718 A 2/1993 Tepman et al. ............ 29/25.01
5,188,515 A 2/1993 Horn ........................... 417/63
5,190,373 A 3/1993 Dickson et al. ............. 366/146
5,191,993 A 3/1993 Wanger et al. .............. 220/333
5,193,560 A 3/1993 Tanaka et al. ............ 134/56 R
5,195,878 A 3/1993 Sahiavo et al. ............. 417/393
5,196,134 A 3/1993 Jackson ...................... 252/103
5,201,960 A 4/1993 Starov ......................... 134/11
5,213,485 A 5/1993 Wilden ....................... 417/393
5,213,619 A 5/1993 Jackson et al. ................ 134/1
5,215,592 A 6/1993 Jackson ......................... 134/1
5,217,043 A 6/1993 Novakovi ................... 137/460
5,221,019 A 6/1993 Pechacek et al. ........... 220/315
5,222,876 A 6/1993 Budde ........................ 417/393
5,224,504 A 7/1993 Thompson et al. ......... 134/155
5,225,173 A 7/1993 Wai .............................. 423/2
5,236,602 A 8/1993 Jackson ...................... 210/748
5,236,669 A 8/1993 Simmons et al. ........... 422/113
5,237,824 A 8/1993 Pawliszyn ................... 62/51.1
5,238,671 A 8/1993 Matson et al. .............. 423/397
5,240,390 A 8/1993 Kvinge et al. .............. 417/393
5,243,821 A 9/1993 Schuck et al. ............... 62/50.6
5,246,500 A 9/1993 Samata et al. .............. 118/719
5,250,078 A 10/1993 Saus et al. ..................... 8/475
5,251,776 A 10/1993 Morgan, Jr. et al. ........ 220/360
5,261,965 A 11/1993 Moslehi ......................... 134/1
5,266,205 A 11/1993 Fulton et al. ............... 210/639
5,267,455 A 12/1993 Dewees et al. ............... 68/5 C
5,269,815 A 12/1993 Schlenker et al. ............. 8/475
5,269,850 A 12/1993 Jackson ......................... 134/2
5,274,129 A 12/1993 Natale et al. ............... 549/349
5,280,693 A 1/1994 Heudecker ................... 53/306
5,285,352 A 2/1994 Pastore et al. .............. 361/707
5,288,333 A 2/1994 Tanaka et al. ................ 134/31
5,290,361 A 3/1994 Hayashida et al. ............ 134/2
5,294,261 A 3/1994 McDermott et al. ........... 134/7
5,298,032 A 3/1994 Schlenker et al. ............. 8/475
5,304,515 A 4/1994 Morita et al. ............... 437/231
5,306,350 A 4/1994 Hoy et al. ............... 134/22.14
5,312,882 A 5/1994 DeSimone et al. ......... 526/201
5,313,965 A 5/1994 Palen ........................... 134/61
5,314,574 A 5/1994 Takahashi ................... 156/646
5,316,591 A 5/1994 Chao et al. ................... 134/34
5,320,742 A 6/1994 Fletcher et al. ............... 208/89
5,328,722 A 7/1994 Ghanayem et al. ......... 427/250
5,334,332 A 8/1994 Lee ............................ 252/548
5,334,493 A 8/1994 Fujita et al. ................ 430/463
5,337,446 A 8/1994 Smith et al. ................. 15/21.1
5,339,844 A 8/1994 Stanford, Jr. et al. ....... 134/107
5,352,327 A 10/1994 Witowski ................... 156/646
5,355,901 A 10/1994 Mielnik et al. ............. 134/105
5,356,538 A 10/1994 Wai et al. ................... 210/634
5,364,497 A 11/1994 Chau et al. ................. 156/645
5,368,171 A 11/1994 Jackson ...................... 134/147
5,370,740 A 12/1994 Chao et al. .................... 134/1
5,370,741 A 12/1994 Bergman ....................... 134/3
5,370,742 A 12/1994 Mitchell et al. .............. 134/10
5,377,705 A 1/1995 Smith, Jr. et al. .......... 134/95.3
5,401,322 A 3/1995 Marshall ....................... 134/13
5,403,621 A 4/1995 Jackson et al. .......... 427/255.1
5,403,665 A 4/1995 Alley et al. ................. 428/447
5,404,894 A 4/1995 Shiraiwa ....................... 134/66
5,412,958 A 5/1995 Iliff et al. ...................... 68/5 C
5,417,768 A 5/1995 Smith, Jr. et al. ............. 134/10
5,433,334 A 7/1995 Reneau ....................... 220/319
5,447,294 A 9/1995 Sakata et al. ............... 266/257
5,456,759 A 10/1995 Stanford, Jr. et al. ........... 134/1
5,470,393 A 11/1995 Fukazawa ...................... 134/3
5,474,812 A 12/1995 Truckenmuller et al. 427/430.1
5,482,564 A 1/1996 Douglas et al. ............... 134/18
5,486,212 A 1/1996 Mitchell et al. ............... 8/142
5,494,526 A 2/1996 Paranjpe ........................ 134/1
5,500,081 A 3/1996 Bergman ................. 156/646.1
5,501,761 A 3/1996 Evans et al. ................ 156/344
5,503,176 A 4/1996 Dunmire et al. .............. 137/15
5,505,219 A 4/1996 Lansberry et al. .......... 134/105
5,509,431 A 4/1996 Smith, Jr. et al. .......... 134/95.1
5,514,220 A 5/1996 Wetmore et al. ......... 134/22.18
5,522,938 A 6/1996 O'Brien ......................... 134/1
5,526,834 A 6/1996 Mielnik et al. ............. 134/105
5,533,538 A 7/1996 Marshall .................. 134/104.4
5,547,774 A 8/1996 Gimzewski et al. ........ 428/694
5,550,211 A 8/1996 DeCrosta et al. ........... 528/489
5,571,330 A 11/1996 Kyogoku .................... 118/719
5,580,846 A 12/1996 Hayashida et al. ......... 510/175
5,589,082 A 12/1996 Lin et al. ....................... 216/2
5,589,105 A 12/1996 DeSimone et al. ......... 252/351
5,589,224 A 12/1996 Tepman et al. .......... 427/248.1
5,618,751 A 4/1997 Golden et al. .............. 438/392
5,621,982 A 4/1997 Yamashita et al. ............ 34/203
5,629,918 A 5/1997 Ho et al. .................... 369/112
5,632,847 A 5/1997 Ohno et al. ................. 156/344
5,635,463 A 6/1997 Muraoka .................... 510/175
5,637,151 A 6/1997 Schulz ........................... 134/2
5,641,887 A 6/1997 Beckman et al. .......... 546/26.2
5,644,855 A 7/1997 McDermott et al. .......... 34/516
5,649,809 A 7/1997 Stapelfeldt ................... 417/63
5,656,097 A 8/1997 Olesen et al. .................. 134/1
5,665,527 A 9/1997 Allen et al. ................. 430/325

| | | | |
|---|---|---|---|
| 5,669,251 A | 9/1997 | Townsend et al. | 68/58 |
| 5,672,204 A | 9/1997 | Habuka | 117/204 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,702,228 A | 12/1997 | Tamai et al. | 414/744.5 |
| 5,706,319 A | 1/1998 | Holtz | 376/203 |
| 5,714,299 A | 2/1998 | Combes et al. | 430/137 |
| 5,725,987 A | 3/1998 | Combes et al. | 430/137 |
| 5,726,211 A | 3/1998 | Hedrick et al. | 521/61 |
| 5,730,874 A | 3/1998 | Wai et al. | 210/638 |
| 5,736,425 A | 4/1998 | Smith et al. | 438/778 |
| 5,739,223 A | 4/1998 | DeSimone | 526/89 |
| 5,746,008 A | 5/1998 | Yamashita et al. | 34/211 |
| 5,766,367 A | 6/1998 | Smith et al. | 134/2 |
| 5,769,588 A | 6/1998 | Toshima et al. | 414/217 |
| 5,783,082 A | 7/1998 | DeSimone et al. | 210/634 |
| 5,797,719 A | 8/1998 | James et al. | 417/46 |
| 5,798,126 A | 8/1998 | Fujikawa et al. | 425/78 |
| 5,798,438 A | 8/1998 | Sawan et al. | 528/483 |
| 5,804,607 A | 9/1998 | Hedrick et al. | 521/64 |
| 5,807,607 A | 9/1998 | Smith et al. | 427/96 |
| 5,817,178 A | 10/1998 | Mita et al. | 118/666 |
| 5,847,443 A | 12/1998 | Cho et al. | 257/632 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,061 A | 2/1999 | Lee et al. | 438/705 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | 417/46 |
| 5,893,756 A | 4/1999 | Berman et al. | 438/692 |
| 5,896,870 A | 4/1999 | Huynh et al. | 134/1.3 |
| 5,898,727 A | 4/1999 | Fujikawa et al. | 373/110 |
| 5,900,107 A | 5/1999 | Murphy et al. | 156/359 |
| 5,900,354 A | 5/1999 | Batchelder | 430/395 |
| 5,904,737 A | 5/1999 | Preston et al. | 8/158 |
| 5,906,866 A | 5/1999 | Webb | 427/534 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,934,856 A | 8/1999 | Asakawa et al. | 414/217 |
| 5,934,991 A | 8/1999 | Rush | 454/187 |
| 5,944,996 A | 8/1999 | DeSimone et al. | 210/634 |
| 5,955,140 A | 9/1999 | Smith et al. | 427/96 |
| 5,965,025 A | 10/1999 | Wai et al. | 210/634 |
| 5,975,492 A | 11/1999 | Brenes | 251/175 |
| 5,976,264 A | 11/1999 | McCullough et al. | 134/2 |
| 5,979,306 A | 11/1999 | Fujikawa et al. | 100/90 |
| 5,980,648 A | 11/1999 | Adler | 134/34 |
| 5,981,399 A | 11/1999 | Kawamura et al. | 438/715 |
| 5,989,342 A | 11/1999 | Ikeda et al. | 118/52 |
| 5,992,680 A | 11/1999 | Smith | 220/812 |
| 5,994,696 A | 11/1999 | Tai et al. | 250/288 |
| 6,005,226 A | 12/1999 | Aschner et al. | 219/390 |
| 6,017,820 A | 1/2000 | Ting et al. | 438/689 |
| 6,021,791 A | 2/2000 | Dryer et al. | 134/100.1 |
| 6,024,801 A | 2/2000 | Wallace et al. | 134/1 |
| 6,029,371 A | 2/2000 | Kamikawa et al. | 34/516 |
| 6,035,871 A | 3/2000 | Eui-Yeol | 134/61 |
| 6,037,277 A | 3/2000 | Masakara et al. | 438/787 |
| 6,053,348 A | 4/2000 | Morch | 220/263 |
| 6,056,008 A | 5/2000 | Adams et al. | 137/487.5 |
| 6,063,714 A | 5/2000 | Smith et al. | 438/778 |
| 6,067,728 A | 5/2000 | Farmer et al. | 34/470 |
| 6,077,053 A | 6/2000 | Fujikawa et al. | 417/399 |
| 6,077,321 A | 6/2000 | Adachi et al. | 29/25.01 |
| 6,082,150 A | 7/2000 | Stucker | 68/18 R |
| 6,085,935 A | 7/2000 | Malchow et al. | 220/813 |
| 6,097,015 A | 8/2000 | McCullough et al. | 219/686 |
| 6,099,619 A | 8/2000 | Lansbarkis et al. | 95/118 |
| 6,100,198 A | 8/2000 | Grieger et al. | 438/692 |
| 6,110,232 A | 8/2000 | Chen et al. | 29/25.01 |
| 6,114,044 A | 9/2000 | Houston et al. | 428/447 |
| 6,122,566 A | 9/2000 | Nguyen et al. | 700/218 |
| 6,128,830 A | 10/2000 | Bettcher et al. | 34/404 |
| 6,140,252 A | 10/2000 | Cho et al. | 438/781 |
| 6,145,519 A | 11/2000 | Konishi et al. | 134/95.2 |
| 6,149,828 A | 11/2000 | Vaartstra | 216/57 |
| 6,159,295 A | 12/2000 | Maskara et al. | 118/688 |
| 6,164,297 A | 12/2000 | Kamikawa | 134/61 |
| 6,171,645 B1 | 1/2001 | Smith et al. | 427/96 |
| 6,186,722 B1 | 2/2001 | Shirai | 414/217 |
| 6,200,943 B1 | 3/2001 | Romack et al. | 510/285 |
| 6,203,582 B1 | 3/2001 | Berner et al. | 29/25.01 |
| 6,216,364 B1 | 4/2001 | Tanaka et al. | 34/448 |
| 6,224,774 B1 | 5/2001 | DeSimone et al. | 210/634 |
| 6,228,563 B1 | 5/2001 | Starov et al. | 430/327 |
| 6,228,826 B1 | 5/2001 | DeYoung et al. | 510/291 |
| 6,232,238 B1 | 5/2001 | Chang et al. | 438/725 |
| 6,232,417 B1 | 5/2001 | Rhodes et al. | 526/171 |
| 6,235,634 B1 | 5/2001 | White et al. | 438/680 |
| 6,239,038 B1 | 5/2001 | Wen | 438/745 |
| 6,241,825 B1 | 6/2001 | Wytman | 118/733 |
| 6,242,165 B1 | 6/2001 | Vaartstra | 430/329 |
| 6,244,121 B1 | 6/2001 | Hunter | 73/865.9 |
| 6,251,250 B1 | 6/2001 | Keigler | 205/89 |
| 6,255,732 B1 | 7/2001 | Yokoyama et al. | 257/760 |
| 6,270,531 B1 | 8/2001 | DeYoung et al. | 8/142 |
| 6,270,948 B1 | 8/2001 | Sato et al. | 430/314 |
| 6,277,753 B1 | 8/2001 | Mullee et al. | 438/692 |
| 6,284,558 B1 | 9/2001 | Sakamoto | 438/30 |
| 6,286,231 B1 | 9/2001 | Bergman et al. | 34/410 |
| 6,305,677 B1 | 10/2001 | Lenz | 269/13 |
| 6,306,564 B1 | 10/2001 | Mullee | 430/329 |
| 6,319,858 B1 | 11/2001 | Lee et al. | 438/787 |
| 6,331,487 B2 | 12/2001 | Koch | 438/692 |
| 6,334,266 B1 | 1/2002 | Moritz et al. | 34/337 |
| 6,344,174 B1 | 2/2002 | Miller et al. | 422/98 |
| 6,344,243 B1 | 2/2002 | McClain et al. | 427/388.1 |
| 6,355,072 B1 | 3/2002 | Racette et al. | 8/142 |
| 6,358,673 B1 | 3/2002 | Namatsu | 430/311 |
| 6,361,696 B1 | 3/2002 | Spiegelman et al. | 210/662 |
| 6,367,491 B1 | 4/2002 | Marshall et al. | 134/104.4 |
| 6,380,105 B1 | 4/2002 | Smith et al. | 438/778 |
| 6,388,317 B1 | 5/2002 | Reese | 257/713 |
| 6,389,677 B1 | 5/2002 | Lenz | 29/559 |
| 6,418,956 B1 | 7/2002 | Bloom | 137/14 |
| 6,425,956 B1 | 7/2002 | Cotte et al. | 134/3 |
| 6,436,824 B1 | 8/2002 | Chooi et al. | 438/687 |
| 6,451,510 B1 | 9/2002 | Messick et al. | 430/311 |
| 6,454,519 B1 | 9/2002 | Toshima et al. | 414/805 |
| 6,454,945 B1 | 9/2002 | Weigl et al. | 210/634 |
| 6,458,494 B2 | 10/2002 | Song et al. | 430/5 |
| 6,461,967 B2 | 10/2002 | Wu et al. | 438/705 |
| 6,464,790 B1 | 10/2002 | Sherstinsky et al. | 118/715 |
| 6,465,403 B1 | 10/2002 | Skee | 510/175 |
| 6,472,334 B2 | 10/2002 | Ikakura et al. | 438/778 |
| 6,479,407 B2 | 11/2002 | Yokoyama et al. | 438/788 |
| 6,485,895 B1 | 11/2002 | Choi et al. | 430/330 |
| 6,486,078 B1 | 11/2002 | Rangarajan et al. | 438/778 |
| 6,492,090 B2 | 12/2002 | Nishi et al. | 430/270.1 |
| 6,500,605 B1 | 12/2002 | Mullee et al. | 430/329 |
| 6,503,837 B2 | 1/2003 | Chiou | 438/691 |
| 6,508,259 B1 | 1/2003 | Tseronis et al. | 134/105 |
| 6,509,136 B1 | 1/2003 | Goldfarb et al. | 430/272.1 |
| 6,509,141 B2 | 1/2003 | Mullee | 430/329 |
| 6,521,466 B1 | 2/2003 | Castrucci | 438/5 |
| 6,537,916 B2 | 3/2003 | Mullee et al. | 438/692 |
| 6,541,278 B2 | 4/2003 | Morita et al. | 438/3 |

| | | | | | |
|---|---|---|---|---|---|
| 6,546,946 | B2 | 4/2003 | Dunmire | 137/15.18 |
| 6,550,484 | B1 | 4/2003 | Gopinath et al. | 134/1.2 |
| 6,554,507 | B2 | 4/2003 | Namatsu | 396/611 |
| 6,558,475 | B1 | 5/2003 | Simons et al. | 134/21 |
| 6,561,213 | B2 | 5/2003 | Wang et al. | 137/263 |
| 6,561,220 | B2 | 5/2003 | McCullough et al. | 137/565.12 |
| 6,561,481 | B1 | 5/2003 | Filonczuk | 251/129.12 |
| 6,561,767 | B2 | 5/2003 | Berger et al. | 417/53 |
| 6,562,146 | B1 | 5/2003 | DeYoung et al. | 134/30 |
| 6,564,826 | B2 | 5/2003 | Shen | 137/505.18 |
| 6,565,764 | B2 * | 5/2003 | Hiraoka et al. | 216/56 |
| 6,576,138 | B2 | 6/2003 | Sateria et al. | 210/664 |
| 6,583,067 | B2 | 6/2003 | Chang et al. | 438/723 |
| 6,596,093 | B2 | 7/2003 | DeYoung et al. | 134/36 |
| 6,613,157 | B2 | 9/2003 | DeYoung et al. | 134/36 |
| 6,623,355 | B2 | 9/2003 | McClain et al. | 457/60 |
| 6,635,565 | B2 | 10/2003 | Wu et al. | 438/637 |
| 6,635,582 | B2 | 10/2003 | Yun et al. | 438/745 |
| 6,641,678 | B2 | 11/2003 | DeYoung et al. | 134/36 |
| 6,656,666 | B2 | 12/2003 | Taft et al. | 430/322 |
| 6,669,916 | B2 | 12/2003 | Heim et al. | 423/245.1 |
| 6,673,521 | B2 | 1/2004 | Moreau et al. | 430/315 |
| 6,677,244 | B2 | 1/2004 | Ono et al. | 438/706 |
| 6,685,903 | B2 | 2/2004 | Wong et al. | 423/262 |
| 6,737,725 | B2 | 5/2004 | Grill et al. | 257/522 |
| 6,748,966 | B1 | 6/2004 | Dvorak | 137/216 |
| 6,764,552 | B1 | 7/2004 | Joyce et al. | 134/3 |
| 6,777,312 | B2 | 8/2004 | Yang et al. | 438/464 |
| 6,780,765 | B2 | 8/2004 | Goldstein | 438/660 |
| 6,802,961 | B2 | 10/2004 | Jackson | 210/86 |
| 6,846,789 | B2 * | 1/2005 | Davenhall et al. | 510/285 |
| 6,926,798 | B2 | 8/2005 | Biberger et al. | 156/345.31 |
| 2002/0001929 | A1 | 1/2002 | Biberger et al | 438/584 |
| 2002/0046707 | A1 | 4/2002 | Biberger et al. | 156/345 |
| 2002/0117391 | A1 | 8/2002 | Beam | 203/81 |
| 2003/0003762 | A1 * | 1/2003 | Cotte et al. | 438/745 |
| 2003/0013311 | A1 | 1/2003 | Chang et al. | 438/704 |
| 2003/0045117 | A1 | 3/2003 | Cotte et al. | |
| 2003/0047533 | A1 | 3/2003 | Reid et al. | 216/24 |
| 2003/0106573 | A1 | 6/2003 | Masuda et al. | 134/26 |
| 2003/0116176 | A1 * | 6/2003 | Rothman et al. | 134/1.3 |
| 2003/0125225 | A1 | 7/2003 | Xu et al. | 510/175 |
| 2003/0196679 | A1 | 10/2003 | Cotte et al. | 134/1 |
| 2004/0003828 | A1 * | 1/2004 | Jackson | 134/1 |
| 2004/0020518 | A1 | 2/2004 | DeYoung et al. | 134/30 |
| 2004/0045588 | A1 | 3/2004 | DeYoung et al. | 134/26 |
| 2004/0050406 | A1 * | 3/2004 | Sehgal | 134/26 |
| 2004/0087457 | A1 | 5/2004 | Korzenski et al. | 510/177 |
| 2004/0103922 | A1 | 6/2004 | Inoue et al. | 134/26 |
| 2004/0112402 | A1 | 6/2004 | Simons et al. | |
| 2004/0112409 | A1 | 6/2004 | Schilling | 134/26 |
| 2004/0171502 | A1 | 9/2004 | Clark et al. | |
| 2004/0177867 | A1 | 9/2004 | Schilling | 134/26 |
| 2004/0266635 | A1 | 12/2004 | Korzenski et al. | |
| 2005/0006310 | A1 | 1/2005 | Agrawal et al. | |
| 2005/0245409 | A1 * | 11/2005 | Cernat et al. | 510/175 |

FOREIGN PATENT DOCUMENTS

| | | | |
|---|---|---|---|
| CN | 1399790 | A | 2/2003 |
| DE | 36 08 783 | A1 | 9/1987 |
| DE | 39 04 514 | C2 | 3/1990 |
| DE | 40 04 111 | C2 | 8/1990 |
| DE | 39 06 724 | C2 | 9/1990 |
| DE | 39 06 735 | C2 | 9/1990 |
| DE | 39 06 737 | A1 | 9/1990 |
| DE | 44 29 470 | A1 | 3/1995 |
| DE | 43 44 021 | A1 | 6/1995 |
| DE | 198 60 084 | A1 | 7/2000 |
| EP | 0 244 951 | A2 | 11/1987 |
| EP | 02 72 141 | A2 | 6/1988 |
| EP | 0 283 740 | A2 | 9/1988 |
| EP | 0 302 345 | A2 | 2/1989 |
| EP | 0 370 233 | A1 | 5/1990 |
| EP | 0 391 035 | A2 | 10/1990 |
| EP | 0 453 867 | A1 | 10/1991 |
| EP | 0 518 653 | B1 | 12/1992 |
| EP | 0 536 752 | A2 | 4/1993 |
| EP | 0 572 913 | A1 | 12/1993 |
| EP | 0 587 168 | A1 | 3/1994 |
| EP | 0 620 270 | A3 | 10/1994 |
| EP | 0 679 753 | B1 | 11/1995 |
| EP | 0 711 864 | B1 | 5/1996 |
| EP | 0 726 099 | A2 | 8/1996 |
| EP | 0 727 711 | A2 | 8/1996 |
| EP | 0 822 583 | A2 | 2/1998 |
| EP | 0 829 312 | A2 | 3/1998 |
| EP | 0 836 895 | A2 | 4/1998 |
| EP | 0 903 775 | A2 | 3/1999 |
| FR | 1 499 491 | | 9/1967 |
| GB | 2 003 975 | | 3/1979 |
| GB | 2 193 482 | | 2/1988 |
| JP | 60-192333 | | 9/1985 |
| JP | 60-2348479 | | 11/1985 |
| JP | 60-246635 | | 12/1985 |
| JP | 61-017151 | | 1/1986 |
| JP | 61-231166 | | 10/1986 |
| JP | 62-111442 | | 5/1987 |
| JP | 62-099619 | | 6/1987 |
| JP | 63-256326 | | 10/1988 |
| JP | 63-303059 | | 12/1988 |
| JP | 1-045131 | | 2/1989 |
| JP | 1-246835 | | 10/1989 |
| JP | 2-148841 | | 6/1990 |
| JP | 2-209729 | | 8/1990 |
| JP | 2-304941 | | 12/1990 |
| JP | 4-284648 | | 10/1992 |
| JP | 7-142333 | | 6/1995 |
| JP | 8-186140 | A | 7/1996 |
| JP | 8-222508 | A | 8/1996 |
| JP | 10-144757 | A | 5/1998 |
| JP | 56-142629 | | 11/1998 |
| JP | 10335408 | A | 12/1998 |
| JP | 11-200035 | | 7/1999 |
| JP | 2000-106358 | | 4/2000 |
| WO | WO 87/07309 | | 12/1987 |
| WO | WO 90/06189 | | 6/1990 |
| WO | WO 90/13675 | | 11/1990 |
| WO | WO 91/12629 | A | 8/1991 |
| WO | WO 93/14255 | | 7/1993 |
| WO | WO 93/14259 | | 7/1993 |
| WO | WO 93/20116 | | 10/1993 |
| WO | WO 96/27704 | | 9/1996 |
| WO | WO 99/18603 | A | 4/1999 |
| WO | WO 99/49998 | | 10/1999 |
| WO | WO 00/36635 | | 6/2000 |
| WO | WO 00/73241 | A1 | 12/2000 |
| WO | WO 01/10733 | A1 | 2/2001 |
| WO | WO 01/33613 | A2 | 5/2001 |
| WO | WO 01/33615 | A3 | 5/2001 |
| WO | WO 01/55628 | A1 | 8/2001 |
| WO | WO 01/68279 | A2 | 9/2001 |
| WO | WO 01/74538 | A1 | 10/2001 |
| WO | WO 01/78911 | A1 | 10/2001 |
| WO | WO 01/85391 | A2 | 11/2001 |
| WO | WO 01/94782 | A2 | 12/2001 |
| WO | WO 02/09894 | A2 | 2/2002 |
| WO | WO 02/11191 | A2 | 2/2002 |
| WO | WO 02/15251 | A1 | 2/2002 |
| WO | WO 02/16051 | A2 | 2/2002 |
| WO | WO 03/030219 | A2 | 10/2003 |

OTHER PUBLICATIONS

*Los Alamos National Laboratory*, Solid State Technology, pp. S10 & S14, Oct. 1998.

*Supercritical Carbon Dioxide Resist Remover, SCORR, the Path to Least Photoresistance*, Los Alamos National Laboratory, 1998.
D. H. Ziger et al., *Compressed Fluid Technology: Application to RIE Developed Resists*, AIChE Journal, vol. 33, No. 10, pp. 1585-1591, Oct. 1987.
Kirk-Othmer, *Alcohol Fuels to Toxicology*, Encyclopedia of Chemical Terminology, 3rd ed., Supplement volume, New York: John Wiley & Sons, pp. 872-893, 1984.
*Cleaning with Supercritical $CO_2$*, NASA Tech Briefs, MFS -29611, Marshall Space Flight Center, Alabama, Mar. 1979.
N. Basta, *Supercritical Fluids: Still Seeking Acceptance*, Chemical Engineering vol. 92, No. 3, pp. 14, Feb. 24, 1985.
D. Takahashi, *Los Alamos Lab Finds Way to Cut Chip Toxic Waste*, Wall Street Journal, Jun. 22, 1998.
*Supercritical $CO_2$ Process Offers Less Mess from Semiconductor Plants*, Chemical Engineering Magazine, pp. 27 & 29, Jul. 1988.
Y. P. Sun, *Preparation of Polymer Protected Semiconductor Nanoparticles Through the Rapid Expansion of Supercritical Fluid Solution*, Chemical Physics Letters, pp. 585-588, May 22, 1998.
K. Jackson et al., *Surfactants and Micromulsions in Supercritical Fluids*, Supercritical Fluid Cleaning, Noyes Publications, Westwood, NJ, pp. 87-120, Spring 1998.
M. Kryszcwski, *Production of Metal and Semiconductor Nanoparticles in Polymer Systems*, Polimery, pp. 65-73, Feb. 1998.
G. L. Bakker et al., *Surface Cleaning and Carbonaceous Film Removal Using High Pressure, High Temperature Water, and Water/$CO_2$ Mixtures*, J Electrochem Soc., vol. 145, No. 1, pp. 284-291, Jan. 1998.
C. K. Ober et al., *Imaging Polymers with Supercritical Carbon Dioxide*, Advanced Materials, vol. 9, No. 13, pp. 1039-1043, Nov. 3, 1997.
E. M. Russick et al., *Supercritical Carbon Dioxide Extraction of Solvent from Micro-Machined Structures*, Supercritical Fluids Extraction and Pollution Prevention, ACS Symposium Series, vol. 670, pp. 255-269, Oct. 21, 1997.
N. Dahmen et al., *Supercritical Fluid Extraction of Grinding and Metal Cutting Waste Contaminated with Oils*, Supercritical Fluids—Extraction and Pollution Prevention, ACS Symposium Series, vol. 670, pp. 270-279, Oct. 21, 1997.
C. M. Wai, *Supercritical Fluid Extraction: Metals as Complexes*, Journal of Chromatography A, vol. 785, pp. 369-383, Oct. 17, 1997.
C. Xu et al., *Submicron-Sized Spherical Yttrium Oxide Based Phosphors Prepared by Supercritical $CO_2$-Assisted Nerosolization and Pyrolysis*, Appl. Phys. Lett., vol. 71, No. 22, pp. 1643-1645, Sep. 22, 1997.
Y. Tomioka et al., *Decomposition of Tetramethylammonium (TMA) in a Positive Photo-resist Developer by Supercritical Water*, Abstracts of Papers 214th ACS Natl Meeting, American Chemical Society, Abstract No. 108, Sep. 7, 1997.
H. Klein et al., *Cyclic Organic Carbonates Serve as Solvents and Reactive Diluents*, Coatings World, pp. 38-40, May 1997.
J. Bühler et al., *Linear Array of Complementary Metal Oxide Semiconductor Double-Pass Metal Micro-mirrors*, Opt. Eng. vol. 36, No. 5, pp. 1391-1398, May 1997.
M. H. Jo et al., *Evaluation of $SiO_2$ Aerogel Thin Film with Ultra Low Dielectric Constant as an Intermetal Dielectric*, Micrelectronic Engineering, vol. 33, pp. 343-348, Jan. 1997.
J. B. McClain et al., *Design of Nonionic Surfactants for Supercritical Carbon Dioxide*, Science, vol. 274, pp. 2049-2052, Dec. 20, 1996.
L. Znaidi et al., *Batch and Semi-Continuous Synthesis of Magnesium Oxide Powders from Hydrolysis and Supercritical Treatment of $Mg(OCH_3)_2$*, Materials Research Bulletin, vol. 31, No. 12, pp. 1527-1535, Dec. 1996.
M. E. Tadros, *Synthesis of Titanium Dioxide Particles in Supercritical $CO_2$*, J. Supercritical Fluids, vol. 9, pp. 172-176, Sep. 1996.
V. G. Courtecuisse et al., *Kinetics of the Titanium Isopropoxide Decomposition in Supercritical Isopropyl Alcohol*, Ind. Eng. Chem. Res., vol. 35, No. 8, pp. 2539-2545, Aug. 1996.
A. Gabor et al., *Block and Random Copolymer Resists Designed for 193 nm Lithography and Environmentally Friendly Supercritical $CO_2$ Development*, SPIE, vol. 2724, pp. 410-417, Jun. 1996.
G. L. Schimek et al., *Supercritical Ammonia Synthesis and Characterization of Four New Alkali Metal Silver Antimony Sulfides . . .*, J. Solid State Chemistry, vol. 123, pp. 277-284, May 1996.
P. Gallagher-Wetmore et al., *Supercritical Fluid Processing: Opportunities for New Resist Materials and Processes*, SPIE, vol. 2725, pp. 289-299, Apr. 1996.
K. I. Papathornas et al., *Debonding of Photoresists by Organic Solvents*, J. Applied Polymer Science, vol. 59, pp. 2029-2037, Mar. 28, 1996.
J. J. Watkins et al., *Polymer/Metal Nanocomposite Synthesis in Supercritical $CO_2$*, Chemistry of Materials, vol. 7, No. 11, pp. 1991-1994, Nov. 1995.
E. F. Gloyna et al., *Supercritical Water Oxidation Research and Development Update*, Environmental Progress, vol. 14, No. 3, pp. 182-192, Aug. 1995.
P. Gallagher-Wetmore et al., *Supercritical Fluid Processing: A New Dry Technique for Photoresist Developing*, SPIE, vol. 2438, pp. 694-708, Jun. 1995.
A. H. Gabor et al., *Silicon-Containing Block Copolymer Resist Materials*, Microelectronics Technology—Polymers for Advanced Imaging and Packaging, ACS Symposium Series, vol. 615, pp. 281-298, Apr. 1995.
P. C. Tsiartas et al., *Effect of Molecular Weight Distribution on the Dissolution Properties of Novolac Blends*, SPIE, vol. 2438, pp. 264-271, Jun. 1995.
R. D. Allen et al., *Performance Properties of Near-Monodisperse Novolak Resins*, SPIE, vol. 2438, pp. 250-260, Jun. 1995.
P. T. Wood et al., *Synthesis of New Channeled Structures in Supercritical Amines . . .*, Inorg. Chem., vol. 33, pp. 1556-1558, 1994.
J. B. Jerome et al., *Synthesis of New Low-Dimensional Quatemary Compounds . . .*, Inorg. Chem., vol. 33, pp. 1733-1734, 1994.
J. McHardy et al., *Progress in Supercritical $CO_2$ Cleaning*, SAMPE Jour, vol. 29, No. 5, pp. 20-27, Sep. 1993.
R. Purtell et al., *Precision Parts Cleaning Using Supercritical Fluids*, J. Vac. Sci. Technol. A., vol. 11, No. 4, pp. 1696-1701, Jul. 1993.
E. Bok et al., *Supercritical Fluids for Single Wafer Cleaning*, Solid State Technology, pp. 117-120, Jun. 1992.
T. Adschiri et al., *Rapid and Continuous Hydrothermal Crystallization of Metal Oxide Particles in Supercritical Water*, J. Am. Ceram. Cos., vol. 75, No. 4, pp. 1019-1022, 1992.
B. N. Hansen et al., *Supercritical Fluid Transport—Chemical Deposition of Films*, Chem. Mater, vol. 4, No. 4, pp. 749-752, 1992.
S. H. Page et al., *Predictability and Effect of Phase Behavior of $CO_2$/Propylene Carbonate in Supercritical Fluid Chromatography*, J. Microcol, vol. 3, No. 4, pp. 355-369, 1991.
T. Brokamp et al., *Synthese und Kristallstruktur Eines Gemischtvalenten Lithium-Tantalnitride $Li_2Ta_3N_5$*, J. Alloys and Compounds, vol. 176, pp. 47-60, 1991.
B. M. Hybertson et al., *Deposition of Palladium Films by a Novel Supercritical Transport Chemical Deposition Process*, Mat. Res. Bull., vol. 26, pp. 1127-1133, 1991.
D. W. Matson et al., *Rapid Expansion of Supercritical Fluid Solutions: Solute Formation of Powders, Thin Films, and Fibers*, Ind. Eng. Chem. Res., vol. 26, No. 11, pp. 2298-2306, 1987.
W. K. Tolley et al., *Stripping Organics from Metal and Mineral Surfaces Using Supercritical Fluids*, Separation Science and Technology, vol. 22, pp. 1087-1101, 1987.
*Final Report on the Safety Assessment of Propylene Carbonate*, J. American College of Toxicology, vol. 6, No. 1, pp. 23-51, 1987.
*Porous Xerogel Films as Ultra-Low Permittivity Dielectrics for ULSI Interconnect Applications*, Materials Research Society, pp. 463-469, 1987.
D. Goldfarb et al., *Aqueous-based Photoresist Drying Using Supercritical Carbon Dioxide to Prevent Pattern Collapse*, J. Vacuum Sci. Tech. B, vol. 18, No. 6, pp. 3313, 2000.
H. Namatsu et al., *Supercritical Drying for Water-Rinsed Resist Systems*, J. Vacuum Sci. Tech. B, vol. 18, No. 6, pp. 3308, 2000.
N. Sundararajan et al., *Supercritical $CO_2$ Processing for Submicron Imaging of Fluoropolymers*, Chem. Mater., vol. 12, 41, 2000.

Hideaki Itakura et al., *Multi-Chamber Dry Etching System*, Solid State Technology, pp. 209-214, Apr. 1982.
Joseph L. Foszez, *Diaphragm Pumps Eliminate Seal Problems*, Plant Engineering, pp. 1-5, Feb. 1, 1996.
Bob Agnew, *WILDEN Air-Operated Diaphragm Pumps*, Process & Industrial Training Technologies, Inc., 1996.
Jones et al., *HF Etchant Solutions in Supercritical Carbon Dioxide for "Dry" Etch Processing of Microelectronic Devices*, Chem Mater., vol. 15, 2003, pp. 2867-2869.
Gangopadhyay et al., *Supercritical $CO_2$ Treatments for Semiconductor Applications*, Mat. Res. Soc. Symp. Proc., vol. 812, 2004, pp. F4.6.1-F4.6.6.
European Patent Office, *International Search Report*, PCT/US2005/013885, Oct. 24, 2005, 4 pp.
European Patent Office, Search Report and Written Opinion for corresponding PCT application PCT/US2005/047343, mailed Jun. 13, 2006, 8pp.
Z. Guan et al., *Fluorocarbon-Based Heterophase Polymeric Materials. I. Block Copolymer Surfactants for Carbon Dioxide Applications*, Macromolecules, vol. 27, pp. 5527-5532, 1994.
*International Journal of Environmentally Conscious Design & Manufacturing*, vol. 2, No. 1, pp. 83, 1993.
Matson and Smith , *Supercritical Fluids*, Journal of the American Ceramic Society, vol. 72, No. 6, pp. 872-874, no date noted.
Kawakami et al., *A Super Low-k(k=1,1) Silica Aerogel Film Using Supercritical Drying Technique*, IEEE, pp. 143-145, 2000.
R. F. Reidy, *Effects of Supercritical Processing on Ultra Low-k Films*, Texas Advanced Technology Program, Texas Instruments and the Texas Academy of Mathematics and Science, no date noted.
Anthony Muscat, *Backend Processing Using Supercritical $CO_2$*, University of Arizona, no date noted.

* cited by examiner

METHOD AND SYSTEM FOR TREATING A SUBSTRATE WITH A HIGH PRESSURE FLUID USING FLUOROSILICIC ACID

CROSS-REFERENCE TO RELATED APPLICATIONS

This application is related to U.S. patent application Ser. No. 10/906,349, entitled "Method for Treating a Substrate With a High Pressure Fluid Using a Peroxide-Based Process Chemistry," filed on even date herewith; U.S. patent application Ser. No. 10/987,067, entitled "Method and System for Treating a Substrate Using a Supercritical Fluid," filed on Nov. 12, 2004; U.S. patent application Ser. No. 10/987,066, entitled "Method and System for Cooling a Pump," filed on Nov. 12, 2004; U.S. Pat. application Ser. No. 10/987,594, entitled "A Method for Removing a Residue From a Substrate Using Supercritical Carbon Dioxide Processing," filed on Nov. 12, 2004; and U.S. patent application Ser. No. 10/987,676, entitled "A System for Removing a Residue From a Substrate Using Supercritical Carbon Dioxide Processing," filed on Nov. 12, 2004. The entire contents of these applications are herein incorporated by reference in their entirety.

FIELD OF THE INVENTION

The present invention relates to a method and system for treating a substrate in a high pressure processing system and, more particularly, to a method and system for treating a substrate using a high pressure fluid and a process chemistry comprising fluorosilicic acid in a high pressure processing system.

DESCRIPTION OF RELATED ART

During the fabrication of semiconductor devices for integrated circuits (ICs), a sequence of material processing steps, including both pattern etching and deposition processes, are performed, whereby material is removed from or added to a substrate surface, respectively. During, for instance, pattern etching, a pattern formed in a mask layer of radiation-sensitive material, such as photoresist, using for example photolithography, is transferred to an underlying thin material film using a combination of physical and chemical processes to facilitate the selective removal of the underlying material film relative to the mask layer.

Thereafter, the remaining radiation-sensitive material, or photoresist, and post-etch residue, such as hardened photoresist and other etch residues, are removed using one or more cleaning processes. Conventionally, these residues are removed by performing plasma ashing in an oxygen plasma, followed by wet cleaning through immersion of the substrate in a liquid bath of stripper chemicals.

Until recently, dry plasma ashing and wet cleaning were found to be sufficient for removing residue and contaminants accumulated during semiconductor processing. However, recent advancements for ICs include a reduction in the critical dimension for etched features below a feature dimension acceptable for wet cleaning, such as a feature dimension below approximately 45 to 65 nanometers (nm). Moreover, the advent of new materials, such as low dielectric constant (low-k) materials, limits the use of plasma ashing due to their susceptibility to damage during plasma exposure.

Therefore, at present, interest has developed for the replacement of dry plasma ashing and wet cleaning. One interest includes the development of dry cleaning systems utilizing a supercritical fluid as a carrier for a solvent, or other residue removing composition. At present, the inventors have recognized that conventional processes are deficient in, for example, cleaning residue from a substrate, particularly those substrates following complex etching processes, or having high aspect ratio features.

SUMMARY OF THE INVENTION

The present invention provides a method and system for treating a substrate with a high pressure fluid and a process chemistry in a high pressure processing system. In one embodiment of the invention, there is provided a method and system for treating a substrate with a high pressure fluid and a process chemistry comprising fluorosilicic acid in a high pressure processing system.

According to another embodiment, the method includes placing the substrate in a high pressure processing chamber onto a platen configured to support the substrate; forming a supercritical fluid from a fluid by adjusting a pressure of the fluid above the critical pressure of the fluid, and adjusting a temperature of the fluid above the critical temperature of the fluid; introducing the supercritical fluid to the high pressure processing chamber; introducing a process chemistry comprising fluorosilicic acid to the supercritical fluid; and exposing the substrate to the supercritical fluid and process chemistry.

According to yet another embodiment, the high pressure processing system includes a processing chamber configured to treat the substrate; a platen coupled to the processing chamber, and configured to support the substrate; a high pressure fluid supply system configured to introduce a supercritical fluid to the processing chamber; a fluid flow system coupled to the processing chamber, and configured to flow the supercritical fluid over the substrate in the processing chamber; a process chemistry supply system having a source of fluorosilicic acid and an injection system configured to introduce a process chemistry comprising fluorosilicic acid to the processing chamber; and a temperature control system coupled to one or more of the processing chamber, the platen, the high pressure fluid supply system, the fluid flow system, and the process chemistry supply system, and configured to elevate the supercritical fluid to a temperature approximately equal to 40° C., or greater.

DETAILED DESCRIPTION OF EXEMPLARY EMBODIMENTS

In the following description, to facilitate a thorough understanding of the invention and for purposes of explanation and not limitation, specific details are set forth, such as a particular geometry of the processing system and various descriptions of the system components. However, it should be understood that the invention may be practiced with other embodiments that depart from these specific details.

Figure 1:
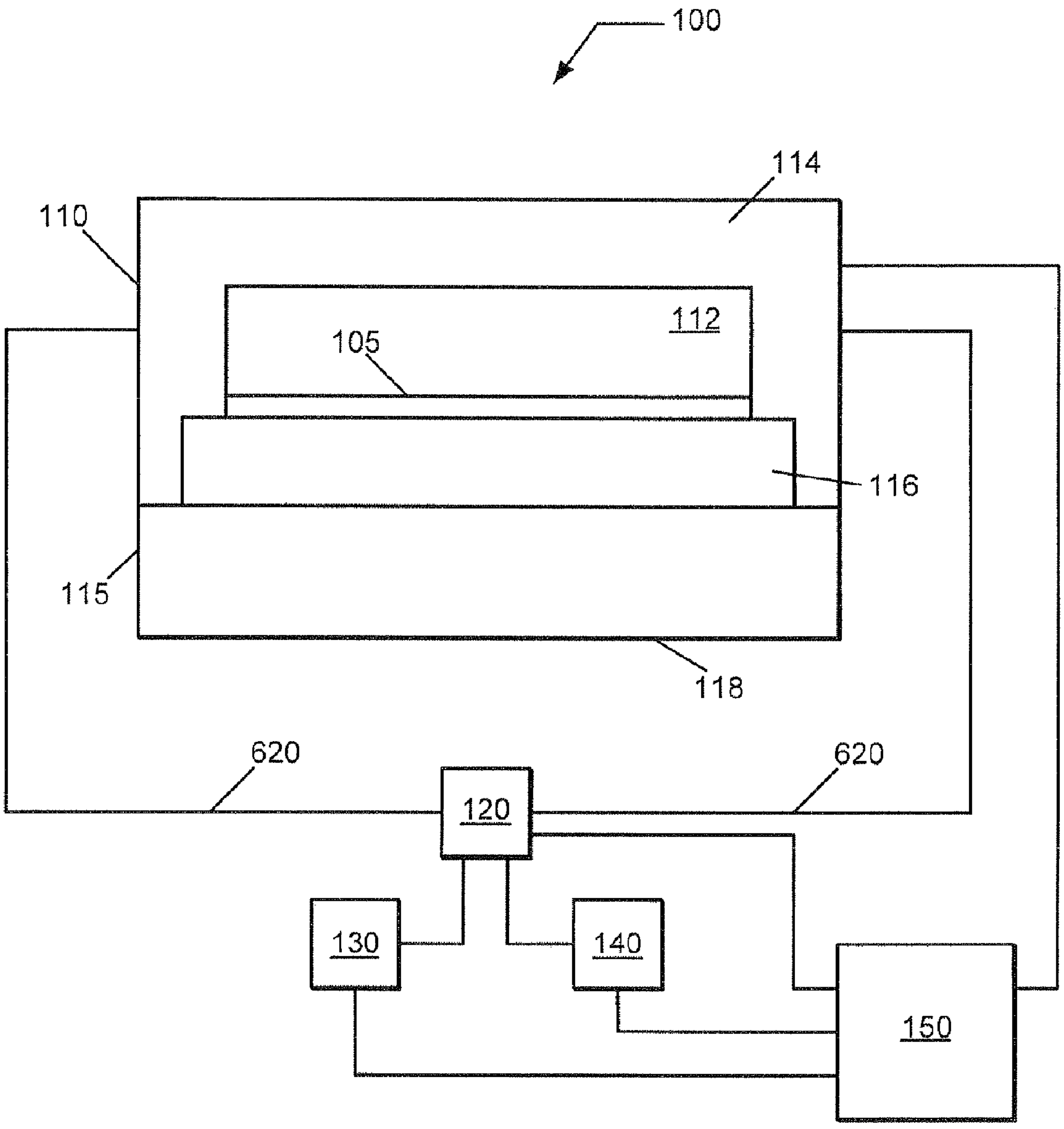
FIG. 1 presents a simplified schematic representation of a processing system.

Referring now to the drawings, wherein like reference numerals designate identical or corresponding parts throughout the several views, FIG. 1 illustrates a processing system 100 according to an embodiment of the invention. In the illustrated embodiment, processing system 100 is configured to treat a substrate 105 with a high pressure fluid, such as a fluid in a supercritical state, and a process chemistry comprising fluorosilicic acid. The processing system 100 comprises processing elements that include a processing chamber 110, a fluid flow system 120, a process chemistry supply system 130, a high pressure fluid supply system 140, and a controller 150, all of which are configured to process substrate 105. The controller 150 can be coupled to the processing chamber 110, the fluid flow system 120, the process chemistry supply system 130, and the high pressure fluid supply system 140.

Alternately, or in addition, controller 150 can be coupled to a one or more additional controllers/computers (not shown), and controller 150 can obtain setup and/or configuration information from an additional controller/computer.

In FIG. 1, singular processing elements (110, 120, 130, 140, and 150) are shown, but this is not required for the invention. The processing system 100 can comprise any number of processing elements having any number of controllers associated with them in addition to independent processing elements.

The controller 150 can be used to configure any number of processing elements (110, 120, 130, and 140), and the controller 150 can collect, provide, process, store, and display data from processing elements. The controller 150 can comprise a number of applications for controlling one or more of the processing elements. For example, controller 150 can include a graphic user interface (GUI) component (not shown) that can provide easy to use interfaces that enable a user to monitor and/or control one or more processing elements.

Referring still to FIG. 1, the fluid flow system 120 is configured to flow fluid and chemistry from the supplies 130 and 140 through the processing chamber 110. The fluid flow system 120 is illustrated as a recirculation system through which the fluid and chemistry recirculate from and back to the processing chamber 110 via primary flow line 620. This recirculation is most likely to be the preferred configuration for many applications, but this is not necessary to the invention. Fluids, particularly inexpensive fluids, can be passed through the processing chamber 110 once and then discarded, which might be more efficient than reconditioning them for re-entry into the processing chamber. Accordingly, while the fluid flow system or recirculation system 120 is described as a recirculating system in the exemplary embodiments, a non-recirculating system may, in some cases, be substituted. This fluid flow system 120 can include one or more valves (not shown) for regulating the flow of a processing solution through the fluid flow system 120 and through the processing chamber 110. The fluid flow system 120 can comprise any number of back-flow valves, filters, pumps, and/or heaters (not shown) for maintaining a specified temperature, pressure or both for the processing solution and for flowing the process solution through the fluid flow system 120 and through the processing chamber 110. Furthermore, any one of the many components provided within the fluid flow system 120 may be heated to a temperature consistent with the specified process temperature.

Some components, such as a fluid flow or recirculation pump, may require cooling in order to permit proper functioning. For example, some commercially available pumps, having specifications required for processing performance at high pressure and cleanliness during supercritical processing, comprise components that are limited in temperature. Therefore, as the temperature of the fluid and structure are elevated, cooling of the pump is required to maintain its functionality. Fluid flow system 120 for circulating the supercritical fluid through processing chamber 110 can comprise a primary flow line 620 coupled to high pressure processing chamber 110, and configured to supply the supercritical fluid at a fluid temperature above the critical temperature of the fluid, for example equal to or greater than 40° C., to the high pressure processing chamber 110, and a high temperature pump 600, shown and described below with reference to FIGS. 2A and 2B, coupled to the primary flow line 620. The high temperature pump 600 can be configured to move the supercritical fluid through the primary flow line 620 to the processing chamber 110, wherein the high temperature pump comprises a coolant inlet configured to receive a coolant and a coolant outlet configured to discharge the coolant. A heat exchanger coupled to the coolant inlet can be configured to lower a coolant temperature of the coolant to a temperature less than or equal to the fluid temperature of the supercritical fluid.

Figure 2A:
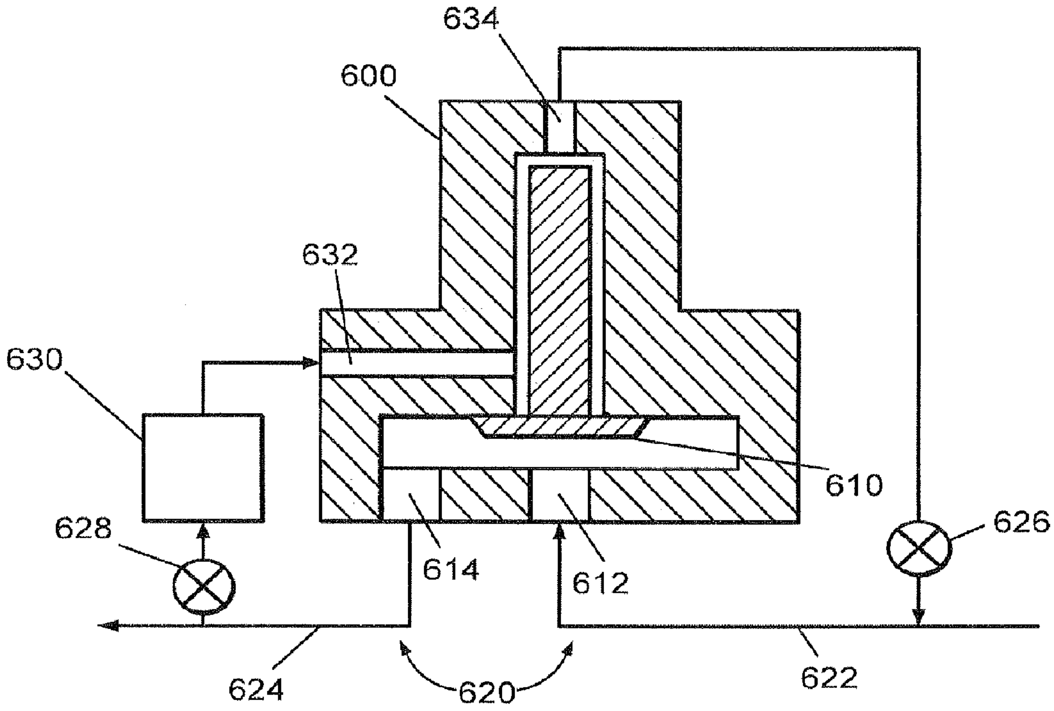
FIG. 2A depicts a system configured to cool a pump.

As illustrated in FIG. 2A, one embodiment is provided for cooling a high temperature pump 600 associated with fluid flow system 120 (or 220 described below with reference to FIG. 3) by diverting high pressure fluid from a primary flow line 620 to the high pressure processing chamber 110 (or 210) through a heat exchanger 630, through the pump 600, and back to the primary flow line 620. For example, a pump impeller 610 housed within pump 600 can move high pressure fluid from a suction side 622 of primary flow line 620 through an inlet 612 and through an outlet 614 to a pressure side 624 of the primary flow line 620. A fraction of high pressure fluid can be diverted through an inlet valve 628, through heat exchanger 630, and enter pump 600 through coolant inlet 632. Thereafter, the fraction of high pressure fluid utilized for cooling can exit from pump 600 at coolant outlet 634 and return to the primary flow line 620 through outlet valve 626.

Figure 2B:
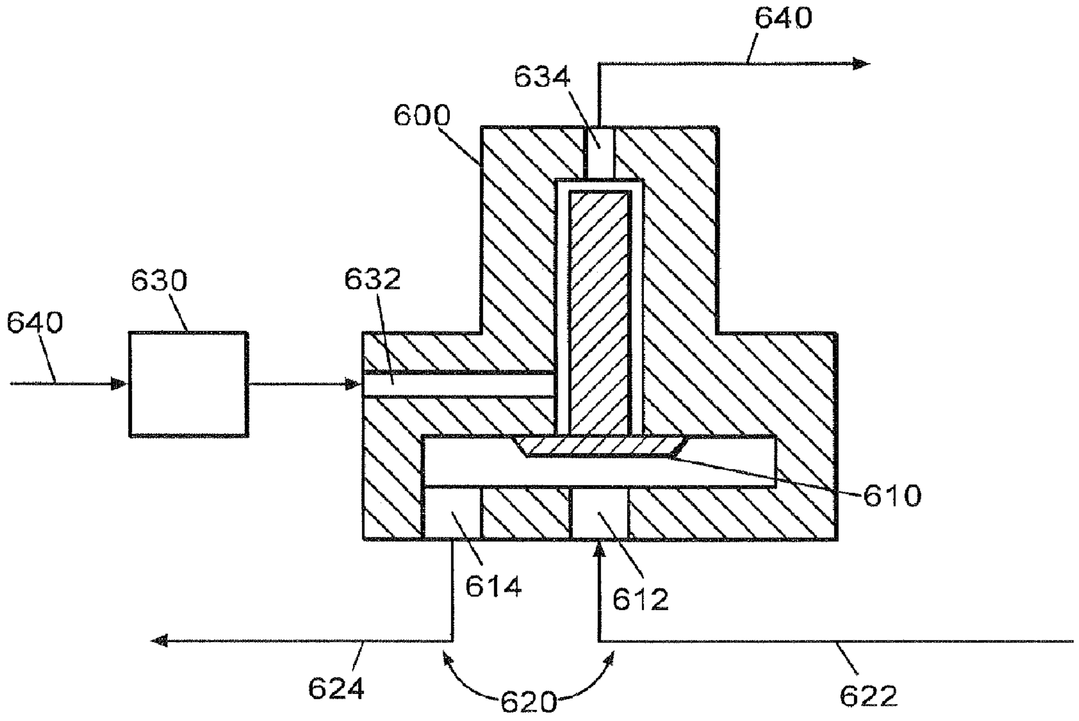
FIG. 2B depicts another system configured to cool a pump.

Alternatively, as illustrated in FIG. 2B, another embodiment is provided for cooling pump 600 using a secondary flow line 640. A high pressure fluid, such as a supercritical fluid, from a fluid source (not shown) is directed through heat exchanger 630 (to lower the temperature of the fluid), and then enters pump 600 through coolant inlet 632, passes through pump 600, exits through coolant outlet 634, and continues to a discharge system (not shown). The fluid source can include a supercritical fluid source, such as a supercritical carbon dioxide source. The fluid source may or may not be a member of the high pressure fluid supply system 140 (or 240) described in FIG. 1 (or FIG. 3). The discharge system can include a vent, or the discharge system can include a recirculation system having a pump configured to recirculate the high pressure fluid through the heat exchanger 630 and pump 600.

Additional details regarding pump design are provided in co-pending U.S. patent application Ser. No. 10/987,066, entitled "Method and System for Cooling a Pump," the entire content of which is herein incorporated by reference in its entirety.

Referring again to FIG. 1, the processing system 100 can comprise high pressure fluid supply system 140. The high pressure fluid supply system 140 can be coupled to the fluid flow system 120, but this is not required. In alternate embodiments, high pressure fluid supply system 140 can be configured differently and coupled differently. For example, the fluid supply system 140 can be coupled directly to the processing chamber 110. The high pressure fluid supply system 140 can include a supercritical fluid supply system. A supercritical fluid as referred to herein is a fluid that is in a supercritical state, which is that state that exists when the fluid is maintained at or above the critical pressure and at or above the critical temperature on its phase diagram. In such a supercritical state, the fluid possesses certain properties, one of which is the substantial absence of surface tension. Accordingly, a supercritical fluid supply system, as referred to herein, is one that delivers to a processing chamber a fluid that assumes a supercritical state at the pressure and temperature at which the processing chamber is being controlled. Furthermore, it is only necessary that at least at or near the critical point the fluid is in substantially a supercritical state at which its properties are sufficient, and exist long enough, to realize their advantages in the process being performed. Carbon dioxide, for example, is a supercritical fluid when maintained at or above a pressure of about 1070 psi at a temperature of 31° C. This state of the fluid in the processing chamber may be maintained by operating the processing chamber at 2000 to 10000 psi at a temperature, for example, of approximately 40° C. or greater.

As described above, the fluid supply system 140 can include a supercritical fluid supply system, which can be a carbon dioxide supply system. For example, the fluid supply system 140 can be configured to introduce a high pressure fluid having a pressure substantially near the critical pressure for the fluid. Additionally, the fluid supply system 140 can be configured to introduce a supercritical fluid, such as carbon dioxide in a supercritical state. Additionally, for example, the fluid supply system 140 can be configured to introduce a supercritical fluid, such as supercritical carbon dioxide, at a pressure ranging from approximately the critical pressure of carbon dioxide to 10,000 psi. Examples of other supercritical fluid species useful in the broad practice of the invention include, but are not limited to, carbon dioxide (as described above), oxygen, argon, krypton, xenon, ammonia, methane, methanol, dimethyl ketone, hydrogen, water, and sulfur hexafluoride. The fluid supply system can, for example, comprise a carbon dioxide source (not shown) and a plurality of flow control elements (not shown) for generating a supercritical fluid. For example, the carbon dioxide source can include a $CO_2$ feed system, and the flow control elements can include supply lines, valves, filters, pumps, and heaters. The fluid supply system 140 can comprise an inlet valve (not shown) that is configured to open and close to allow or prevent the stream of supercritical carbon dioxide from flowing into the processing chamber 110. For example, controller 150 can be used to determine fluid parameters such as pressure, temperature, process time, and flow rate.

Referring still to FIG. 1, the process chemistry supply system 130 is coupled to the recirculation system 120, but this is not required for the invention. In alternate embodiments, the process chemistry supply system 130 can be configured differently, and can be coupled to different elements in the processing system 100. The process chemistry is introduced by the process chemistry supply system 130 into the fluid introduced by the fluid supply system 140 at ratios that vary with the substrate properties, the chemistry being used and the process being performed in the processing chamber 110. Usually the ratio is roughly 1 to 15 percent by volume, which, for a chamber, recirculation system and associated plumbing having a volume of about one liter amounts to about 10 to 150 milliliters of process chemistry in most cases, but the ratio may be higher or lower.

The process chemistry supply system 130 can be configured to introduce one or more of the following process compositions, but not limited to: cleaning compositions for removing contaminants, residues, hardened residues, photoresist, hardened photoresist, post-etch residue, post-ash residue, post chemical-mechanical polishing (CMP) residue, post-polishing residue, or post-implant residue, or any combination thereof; cleaning compositions for removing particulate; drying compositions for drying thin films, porous thin films, porous low dielectric constant materials, or air-gap dielectrics, or any combination thereof; film-forming compositions for preparing dielectric thin films, metal thin films, or any combination thereof; healing compositions for restoring the dielectric constant of low dielectric constant (low-k) films; sealing compositions for sealing porous films; or any combination thereof. Additionally, the process chemistry supply system 130 can be configured to introduce solvents, co-solvents, surfactants, etchants, acids, bases, chelators, oxidizers, film-forming precursors, or reducing agents, or any combination thereof.

The process chemistry supply system 130 can be configured to introduce N-methyl pyrrolidone (NMP), diglycol amine, hydroxyl amine, di-isopropyl amine, tri-isopropyl amine, tertiary amines, catechol, ammonium fluoride, ammonium bifluoride, methylacetoacetamide, ozone, propylene glycol monoethyl ether acetate, acetylacetone, dibasic esters, ethyl lactate, $CHF_3$, $BF_3$, HF, other fluorine containing chemicals, or any mixture thereof. Other chemicals such as organic solvents may be utilized independently or in conjunction with the above chemicals to remove organic materials. The organic solvents may include, for example, an alcohol, ether, and/or glycol, such as acetone, diacetone alcohol, dimethyl sulfoxide (DMSO), ethylene glycol, methanol, ethanol, propanol, or isopropanol (IPA). For further details, see U.S. Pat. No. 6,306,564B1, filed May 27, 1998, and titled "REMOVAL OF RESIST OR RESIDUE FROM SEMICONDUCTORS USING SUPERCRITICAL CARBON DIOXIDE," and U.S. Pat. No. 6,509,141B2, filed Sep. 3, 1999, and titled "REMOVAL OF PHOTORESIST AND PHOTORESIST RESIDUE FROM SEMICONDUCTORS USING SUPERCRITICAL CARBON DIOXIDE PROCESS," both incorporated by reference herein.

Additionally, the process chemistry supply system 130 can comprise a cleaning chemistry assembly (not shown) for providing cleaning chemistry for generating supercritical cleaning solutions within the processing chamber. The cleaning chemistry can include peroxides and a fluoride source. For example, the peroxides can include hydrogen peroxide, benzoyl peroxide, or any other suitable peroxide, and the fluoride sources can include fluoride salts (such as ammonium fluoride salts), hydrogen fluoride, fluoride adducts (such as organo-ammonium fluoride adducts), and combinations thereof. Further details of fluoride sources and methods of generating supercritical processing solutions with fluoride sources are described in U.S. patent application Ser. No. 10/442,557, filed May 20, 2003, and titled "TETRA-ORGANIC AMMONIUM FLUORIDE AND HF IN SUPERCRITICAL FLUID FOR PHOTORESIST AND RESIDUE REMOVAL," and U.S. patent application Ser. No. 10/321,341, filed Dec. 16, 2002, and titled "FLUORIDE IN SUPERCRITICAL FLUID FOR PHOTORESIST POLYMER AND RESIDUE REMOVAL," both incorporated by reference herein.

Furthermore, the process chemistry supply system 130 can be configured to introduce chelating agents, complexing agents and other oxidants, organic and inorganic acids that can be introduced into the supercritical fluid solution with one or more carrier solvents, such as N,N-dimethylacetamide (DMAc), gamma-butyrolactone (BLO), dimethyl sulfoxide (DMSO), ethylene carbonate (EC), butylenes carbonate (BC), propylene carbonate (PC), N-methyl pyrrolidone (NMP), dimethylpiperidone, propylene carbonate, and alcohols (such a methanol, ethanol and 2-propanol).

Moreover, the process chemistry supply system 130 can comprise a rinsing chemistry assembly (not shown) for providing rinsing chemistry for generating supercritical rinsing solutions within the processing chamber. The rinsing chemistry can include one or more organic solvents including, but not limited to, alcohols and ketone. In one embodiment, the rinsing chemistry can comprise sulfolane, also known as thiocyclopentane-1,1-dioxide, (cyclo)tetramethylene sulphone and 2,3,4,5-tetrahydrothiophene-1,1-dioxide, which can be purchased from a number of venders, such as Degussa Stanlow Limited, Lake Court, Hursley Winchester SO21 2LD UK.

Moreover, the process chemistry supply system 130 can be configured to introduce treating chemistry for curing, cleaning, healing (or restoring the dielectric constant of low-k materials), or sealing, or any combination, low dielectric constant films (porous or non-porous). The chemistry can include hexamethyidisilazane (HMDS), chlorotrimethylsilane (TMCS), trichloromethylsilane (TCMS), dimethylsilyldiethylamine (DMSDEA), tetramethyldisilazane (TMDS), trimethylsilyldimethylamine (TMSDMA), dimethylsilyldimethylamine (DMSDMA), trimethylsilyldiethylamine (TMSDEA), bistrimethylsilyl urea (BTSU), bis(dimethylamino)methyl silane (B[DMA]MS), bis (dimethylamino)dimethyl silane (B[DMA]DS), HMCTS, dimethylaminopentamethyldisilane (DMAPMDS), dimethylaminodimethyldisilane (DMADMDS), disila-aza-cyclopentane (TDACP), disila-oza-cyclopentane (TDOCP), methyltrimethoxysilane (MTMOS), vinyltrimethoxysilane (VTMOS), or trimethylsilylimidazole (TMSI). Additionally, the chemistry may include N-tert-butyl-1,1-dimethyl-1-(2,3,4,5-tetramethyl-2,4-cyclopentadiene-1-yl)silanamine, 1,3-diphenyl-1,1,3,3-tetramethy or tert-butylchlorodiphenylsilane. For further details, see U.S. patent application Ser. No. 10/682,196, filed Oct. 10, 2003, and titled "METHOD AND SYSTEM FOR TREATING A DIELECTRIC FILM," and U.S. patent application Ser. No. 10/379,984, filed Mar. 4, 2003, and titled "METHOD OF PASSIVATING LOW DIELECTRIC MATERIALS IN WAFER PROCESSING," both incorporated by reference herein.

Moreover, the process chemistry supply system 130 can be configured to introduce a peroxide during, for instance, cleaning processes. The peroxide can be introduced with any one of the above process chemistries, or any mixture thereof. The peroxide can include organic peroxides, or inorganic peroxides, or a combination thereof. For example, organic peroxides can include 2-butanone peroxide; 2,4-pentanedione peroxide; peracetic acid; t-butyl hydroperoxide; benzoyl peroxide; or m-chloroperbenzoic acid (mCPBA). Other peroxides can include hydrogen peroxide. Alternatively, the peroxide can include a diacyl peroxide, such as: decanoyl peroxide; lauroyl peroxide; succinic acid peroxide; or benzoyl peroxide; or any combination thereof. Alternatively, the peroxide can include a dialkyl peroxide, such as: dicumyl peroxide; 2,5-di(t-butylperoxy)-2,5-dimethylhexane; t-butyl cumyl peroxide; α,α-bis(t-butylperoxy)diisopropylbenzene mixture of isomers; di(t-amyl) peroxide; di(t-butyl) peroxide; or 2,5-di(t-butylperoxy)-2,5-dimethyl-3-hexyne; or any combination thereof. Alternatively, the peroxide can include a diperoxyketal, such as: 1,1-di(t-butylperoxy)-3,3,5-trimethylcyclohexane; 1,1-di(t-butylperoxy)cyclohexane; 1,1-di (t-amylperoxy)-cyclohexane; n-butyl 4,4-di(t-butylperoxy) valerate; ethyl 3,3-di-(t-amylperoxy)butanoate; t-butyl peroxy-2-ethylhexanoate; or ethyl 3,3-di(t-butylperoxy)butyrate; or any combination thereof. Alternatively, the peroxide can include a hydroperoxide, such as: cumene hydroperoxide; or t-butyl hydroperoxide; or any combination thereof. Alternatively, the peroxide can include a ketone peroxide, such as: methyl ethyl ketone peroxide; or 2,4-pentanedione peroxide; or any combination thereof. Alternatively, the peroxide can include a peroxydicarbonate, such as: di(n-propyl)peroxydicarbonate; di(sec-butyl)peroxydicarbonate; or di(2-ethylhexyl)peroxydicarbonate; or any combination thereof. Alternatively, the peroxide can include a peroxyester, such as: 3-hydroxyl-1,1-dimethylbutyl peroxyneodecanoate; α-cumyl peroxyneodecanoate; t-amyl peroxyneodecanoate; t-butyl peroxyneodecanoate; t-butyl peroxypivalate; 2,5-di(2-ethylhexanoylperoxy)-2,5-dimethylhexane; t-amyl peroxy-2-ethylhexanoate; t-butyl peroxy-2-ethylhexanoate; t-amyl peroxyacetate; t-butyl peroxyacetate; t-butyl peroxybenzoate; OO-(t-amyl) O-(2-ethylhexyl)monoperoxycarbonate; OO-(t-butyl) O-isopropyl monoperoxycarbonate; OO-(t-butyl) O-(2-ethylhexyl)monoperoxycarbonate; polyether poly-t-butylperoxy carbonate; or t-butyl peroxy-3,5,5-trimethylhexanoate; or any combination thereof. Alternatively, the peroxide can include any combination of peroxides listed above.

In accordance with one embodiment of the present invention, the process chemistry supply system 130 is configured to introduce fluorosilicic acid. Alternatively, the process chemistry supply system is configured to introduce fluorosilicic acid with a solvent, a co-solvent, a surfactant, an acid, a base, a peroxide, or an etchant. Alternatively, the fluorosilicic acid can be introduced in combination with any of the chemicals presented above. For example, fluorosilicic acid can be introduced with N,N-dimethylacetamide (DMAc), gamma-butyrolactone (BLO), dimethyl sulfoxide (DMSO), ethylene carbonate (EC), butylene carbonate (BC), propylene carbonate (PC), N-methyl pyrrolidone (NMP), dimethylpiperidone, propylene carbonate, or an alcohol (such a methanol (MeOH), isopropyl alcohol (IPA), or ethanol).

The processing chamber 110 can be configured to process substrate 105 by exposing the substrate 105 to fluid from the fluid supply system 140 and process chemistry from the process chemistry supply system 130 in a processing space 112. Additionally, processing chamber 110 can include an upper chamber assembly 114, and a lower chamber assembly 115.

The upper chamber assembly 112 can comprise a heater (not shown) for heating the processing chamber 110, the substrate 105, or the processing fluid, or a combination of two or more thereof. Alternately, a heater is not required. Additionally, the upper chamber assembly 112 can include flow components for flowing a processing fluid through the processing chamber 110. In one example, a circular flow pattern can be established. Alternately, the flow components for flowing the fluid can be configured differently to affect a different flow pattern. Alternatively, the upper chamber assembly 112 can be configured to fill the processing chamber 110.

The lower chamber assembly 115 can include a platen 116 configured to support substrate 105 and a drive mechanism 118 for translating the platen 116 in order to load and unload substrate 105, and seal lower chamber assembly 115 with upper chamber assembly 114. The platen 116 can also be configured to heat or cool the substrate 105 before, during, and/or after processing the substrate 105. For example, the platen 116 can include one or more heater rods configured to elevate the temperature of the platen to approximately 31° C. or greater. Additionally, the lower assembly 115 can include a lift pin assembly for displacing the substrate 105 from the upper surface of the platen 116 during substrate loading and unloading.

Additionally, controller 150 includes a temperature control system coupled to one or more of the processing chamber 110, the fluid flow system 120 (or recirculation system), the platen 116, the high pressure fluid supply system 140, or the process chemistry supply system 130. The temperature control system is coupled to heating elements embedded in one or more of these systems, and configured to elevate and maintain the temperature of the supercritical fluid to above the fluid's critical temperature, for example, approximately 31° C. or greater. The heating elements can, for example, include resistive heating elements.

A transfer system (not shown) can be used to move a substrate into and out of the processing chamber 110 through a slot (not shown). In one example, the slot can be opened and closed by moving the platen 116, and in another example, the slot can be controlled using a gate valve (not shown).

The substrate can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, and/or Ta. The dielectric material can include silica, silicon dioxide, quartz, aluminum oxide, sapphire, low dielectric constant materials, Teflon®, and/or polyimide. The ceramic material can include aluminum oxide, silicon carbide, etc.

The processing system 100 can also comprise a pressure control system (not shown). The pressure control system can be coupled to the processing chamber 110, but this is not required. In alternate embodiments, the pressure control system can be configured differently and coupled differently. The pressure control system can include one or more pressure valves (not shown) for exhausting the processing chamber 110 and/or for regulating the pressure within the processing chamber 110. Alternately, the pressure control system can also include one or more pumps (not shown). For example, one pump may be used to increase the pressure within the processing chamber, and another pump may be used to evacuate the processing chamber 110. In another embodiment, the pressure control system can comprise seals for sealing the processing chamber. In addition, the pressure control system can comprise an elevator for raising and lowering the substrate 105 and/or the platen 116.

Furthermore, the processing system 100 can comprise an exhaust control system. The exhaust control system can be coupled to the processing chamber 110, but this is not required. In alternate embodiments, the exhaust control system can be configured differently and coupled differently. The exhaust control system can include an exhaust gas collection vessel (not shown) and can be used to remove contaminants from the processing fluid. Alternately, the exhaust control system can be used to recycle the processing fluid.

Figure 3:
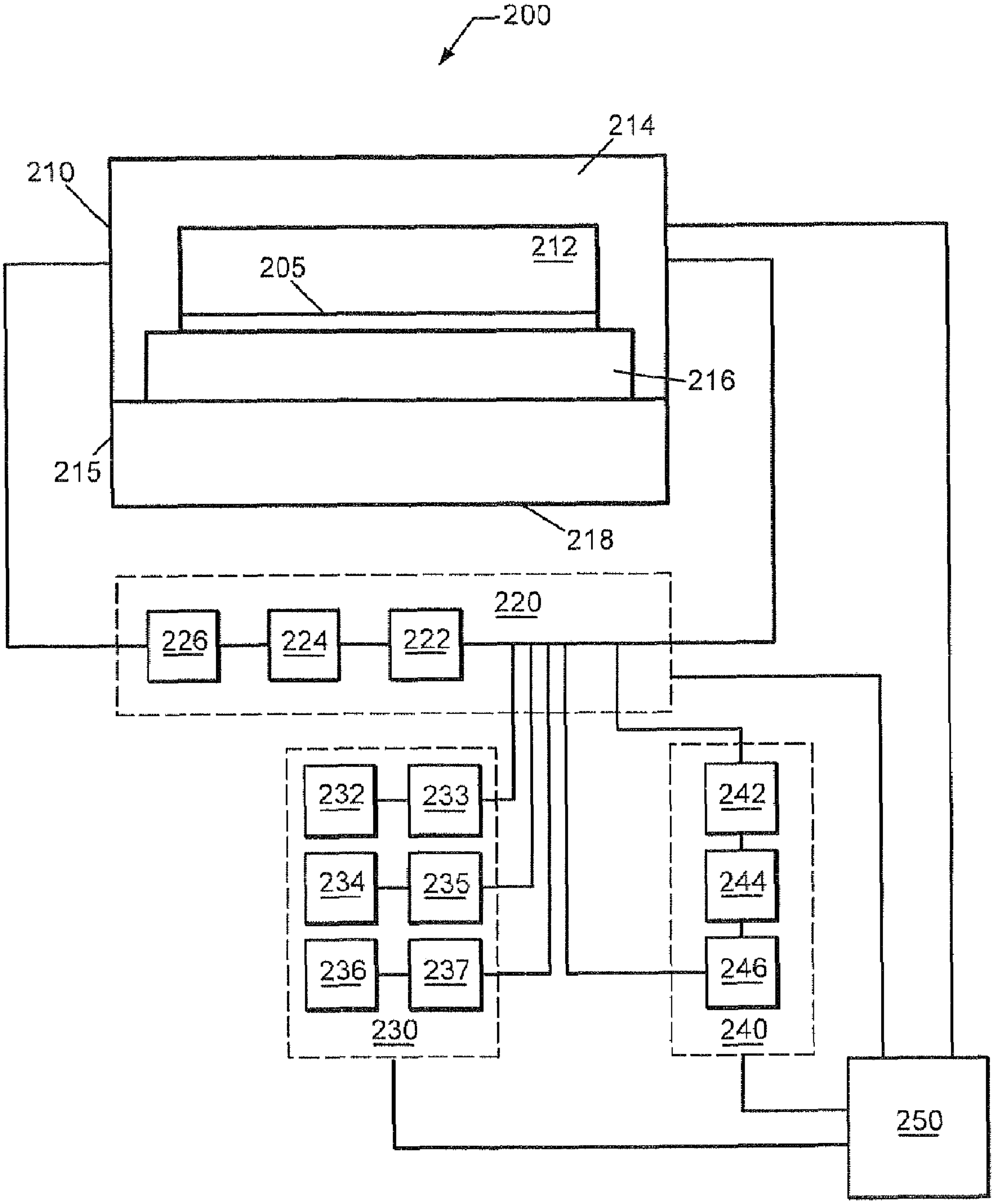
FIG. 3 presents another simplified schematic representation of a processing system.

Referring now to FIG. 3, a processing system 200 is presented according to another embodiment. In the illustrated embodiment, processing system 200 comprises a processing chamber 210, a recirculation system 220, a process chemistry supply system 230, a fluid supply system 240, and a controller 250, all of which are configured to process substrate 205. The controller 250 can be coupled to the processing chamber 210, the recirculation system 220, the process chemistry supply system 230, and the fluid supply system 240. Alternately, controller 250 can be coupled to a one or more additional controllers/computers (not shown), and controller 250 can obtain setup and/or configuration information from an additional controller/computer.

As shown in FIG. 3, the recirculation system 220 can include a recirculation fluid heater 222, a pump 224, and a filter 226. The process chemistry supply system 230 can include one or more chemistry introduction systems, each introduction system having a chemical source 232, 234, 236, and an injection system 233, 235, 237. The injection systems 233, 235, 237 can include a pump (not shown) and an injection valve (not shown). For example, the chemical source can include a source of fluorosilicic acid.

Additional details regarding injection of process chemistry are provided in co-pending U.S. patent application Ser. No. 10/957,417, filed Oct. 1, 2004 entitled "Method and System for Injecting Chemistry into a Supercritical Fluid," the entire content of which is herein incorporated by reference in its entirety.

Furthermore, the fluid supply system 240 can include a supercritical fluid source 242, a pumping system 244, and a supercritical fluid heater 246. In addition, one or more injection valves, and/or exhaust valves may be utilized with the fluid supply system 240.

The processing chamber 210 can be configured to process substrate 205 by exposing the substrate 205 to fluid from the fluid supply system 240 and process chemistry from the process chemistry supply system 230 in a processing space 212. Additionally, processing chamber 210 can include an upper chamber assembly 214, and a lower chamber assembly 215 having a platen 216 and drive mechanism 218, as described above with reference to FIG. 1.

Figure 4:
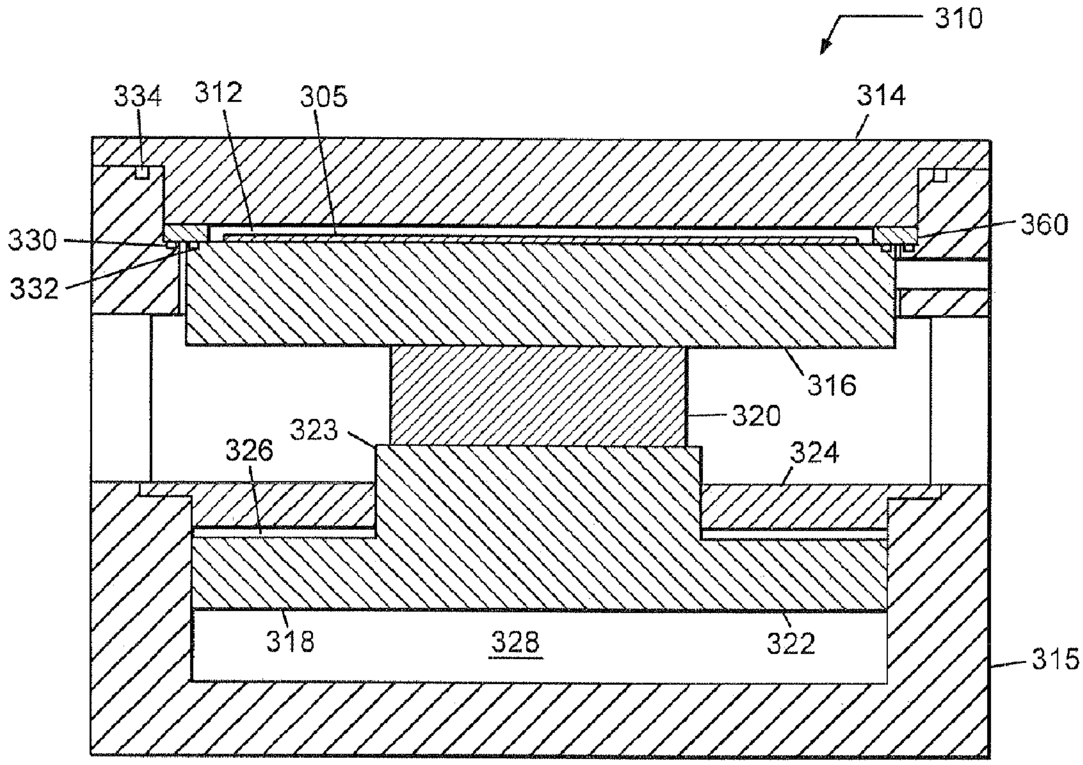
FIG. 4 presents another simplified schematic representation of a processing system.

Alternatively, the processing chamber 210 can be configured as described in pending U.S. patent application Ser. No. 09/912,844 (U.S. Patent Application Publication No. 2002/0046707 A1), entitled "High Pressure Processing Chamber for Semiconductor Substrates," and filed on Jul. 24, 2001, which is incorporated herein by reference in its entirety. For example, FIG. 4 depicts a cross-sectional view of a supercritical processing chamber 310 comprising upper chamber assembly 314, lower chamber assembly 315, platen 316 configured to support substrate 305, and drive mechanism 318 configured to raise and lower platen 316 between a substrate loading/unloading condition and a substrate processing condition. Drive mechanism 318 can further include a drive cylinder 320, drive piston 322 having piston neck 323, sealing plate 324, pneumatic cavity 326, and hydraulic cavity 328. Additionally, supercritical processing chamber 310 further includes a plurality of sealing devices 330, 332, and 334 for providing a sealed, high pressure process space 312 in the processing chamber 310.

Figure 5A:
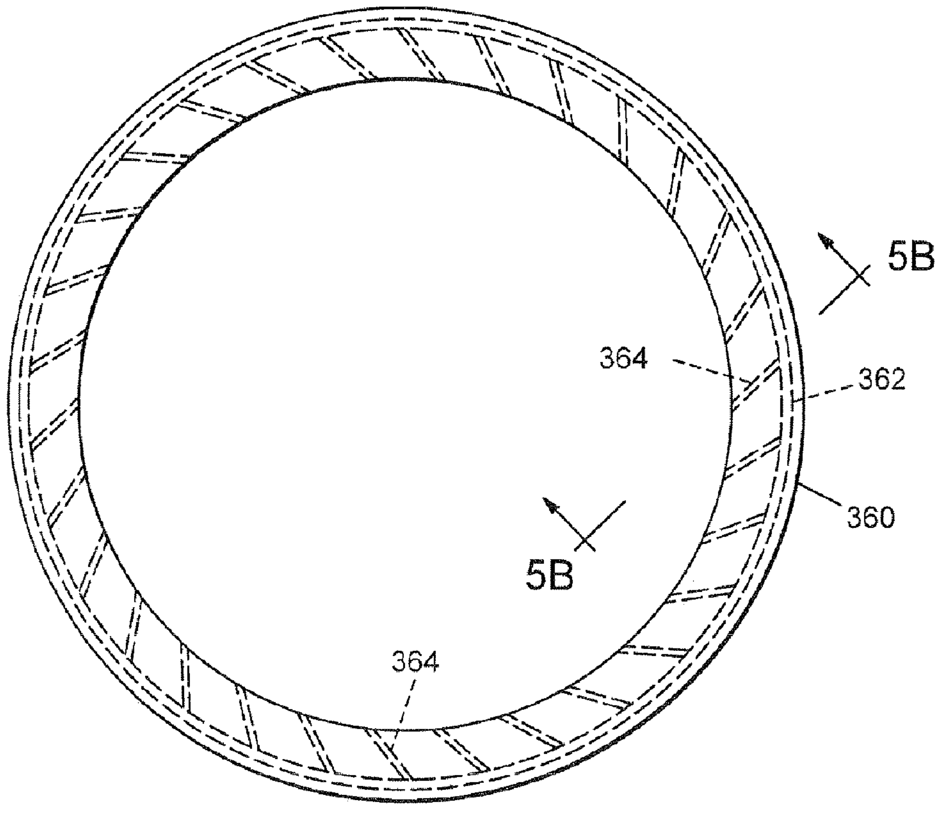
FIGS. 5A and 5B depict a fluid injection manifold for introducing fluid to a processing system.
Figure 5B:
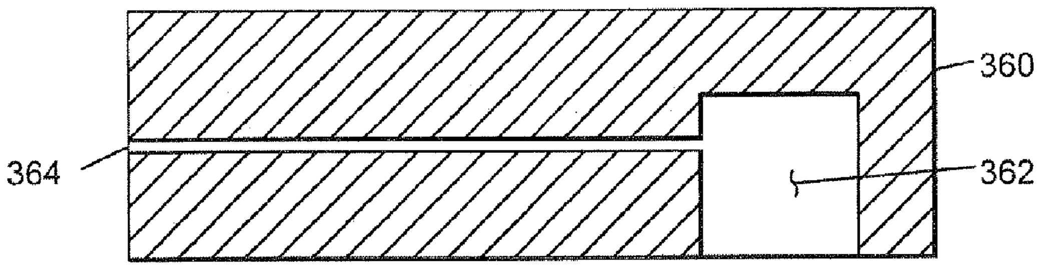

As described above with reference to FIGS. 1, 2, and 3, the fluid flow or recirculation system coupled to the processing chamber is configured to circulate the fluid through the processing chamber, and thereby permit the exposure of the substrate in the processing chamber to a flow of fluid. The fluid, such as supercritical carbon dioxide with process chemistry, can enter the processing chamber at a peripheral edge of the substrate through one or more inlets coupled to the fluid flow system. For example, referring now to FIG. 4 and FIGS. 5A and 5B, an injection manifold 360 is shown as a ring having an annular fluid supply channel 362 coupled to one or more inlets 364. The one or more inlets 364, as illustrated, include forty five (45) injection orifices canted at 45 degrees, thereby imparting azimuthal momentum, or axial momentum, or both, as well as radial momentum to the flow of high pressure fluid through process space 312 above substrate 305. Although shown to be canted at an angle of 45 degrees, the angle may be varied, including direct radial inward injection.

Additionally, the fluid, such as supercritical carbon dioxide, exits the processing chamber adjacent a surface of the substrate through one or more outlets (not shown). For example, as described in U.S. patent application Ser. No. 09/912,844, the one or more outlets can include two outlet holes positioned proximate to and above the center of substrate 305. The flow through the two outlets can be alternated from one outlet to the next outlet using a shutter valve.

Alternatively, the fluid, such as supercritical carbon dioxide, can enter and exit from the processing chamber 110 as described in pending U.S. patent application Ser. No. 10/018,922, filed Dec. 20, 2004 entitled "Method and System for Flowing a Supercritical Fluid in a High Pressure Processing System," the entire content of which is herein incorporated by reference in its entirety.

Figure 6:
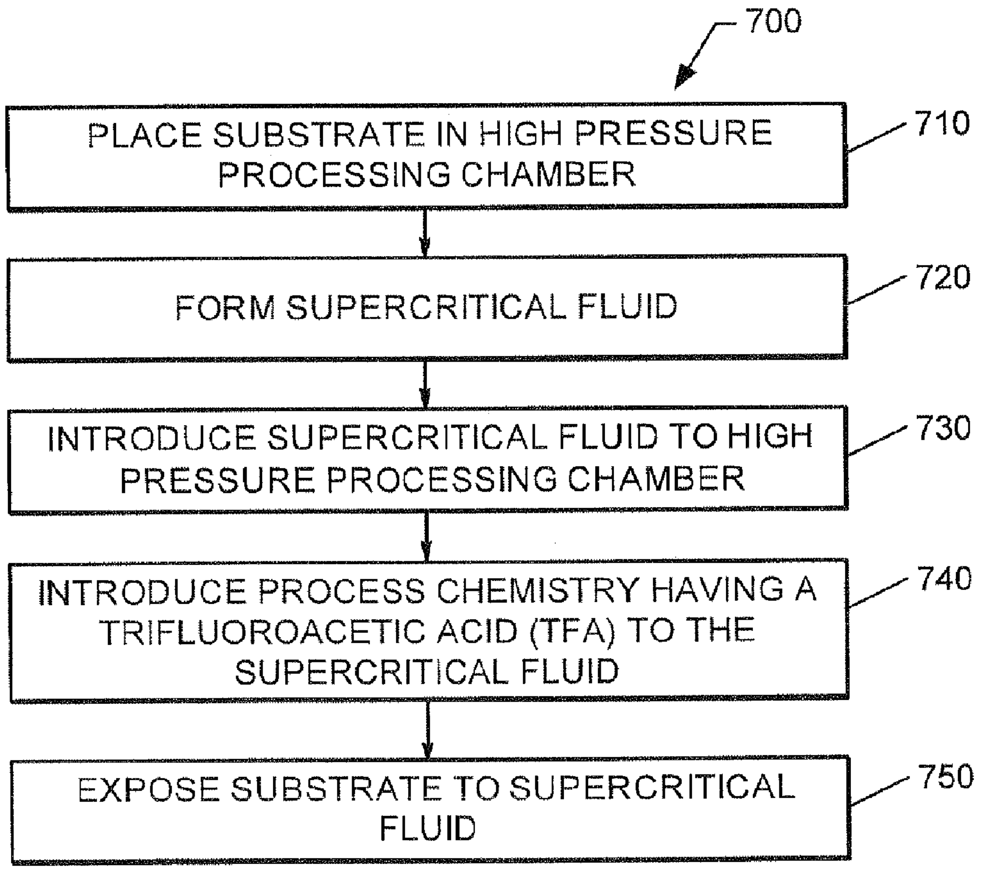
FIG. 6 illustrates a method of treating a substrate in a processing system according to an embodiment of the invention.

Referring now to FIG. 6, a method of treating a substrate with a fluid in a supercritical state is provided. As depicted in flow chart 700, the method begins in 710 with placing a substrate onto a platen within a high pressure processing chamber configured to expose the substrate to a supercritical fluid processing solution.

In 720, a supercritical fluid is formed by bringing a fluid to a supercritical state by adjusting the pressure of the fluid to at or above the critical pressure of the fluid, and adjusting the temperature of the fluid to at or above the critical temperature of the fluid. In 730, the supercritical fluid is introduced to the high pressure processing chamber through one or more inlets and discharged through one or more outlets. The temperature of the supercritical fluid may be elevated to a value equal to or greater than 40° C. In one embodiment, the temperature of the supercritical fluid is elevated to greater than 80° C. to form a high temperature supercritical fluid. In a further embodiment, the temperature of the supercritical fluid is set to equal or greater than 120° C.

In 740, a process chemistry comprising fluorosilicic acid is introduced to the supercritical fluid. The fluorosilicic acid can, for example, be introduced with any one or combination of chemicals presented above. In 750, the substrate is exposed to the supercritical fluid and process chemistry.

Additionally, as described above, the process chemistry can comprise a cleaning composition, a film forming composition, a healing composition, or a sealing composition, or any combination thereof. For example, the process chemistry can comprise a cleaning composition containing fluorosilicic acid. In each of the following examples, the temperature of the supercritical fluid is elevated above approximately 40° C. and is, for example, 135° C. Furthermore, in each of the following examples, the pressure of the supercritical fluid is above the critical pressure and is, for instance, 2900 psi. In one example, the cleaning composition can comprise fluorosilicic acid combined with, for instance, N-methyl pyrrolidone (NMP) in supercritical carbon dioxide. By way of further example, a process recipe for removing post-etch residue(s) can comprise two steps including: (1) exposure of the substrate to a mixture of 200 microliters of fluorosilicic acid and 13 milliliters of NMP in supercritical carbon dioxide for approximately three minutes; and (2) exposure of the substrate to 13 milliliters of NMP in supercritical carbon dioxide for approximately three minutes. The first step can be repeated any number of times. Moreover, any step may be repeated. Additionally, the time duration for each step, or sub-step, may be varied greater than or less than those specified. Further yet, the amount of any chemical in the process chemistry may be varied greater than or less than those specified, and the ratios may be varied. Further yet, the temperature or pressure can be varied.

In another example, the process chemistry can comprise a first cleaning composition comprising a mixture of fluorosilicic acid and gamma-butyrolactone (BLO) in supercritical carbon dioxide, and a second cleaning composition comprising a mixture of fluorosilicic acid and isopropyl alcohol (IPA) in supercritical carbon dioxide. By way of further example, a process recipe for removing post-etch residue(s) can comprise three steps including: (1) exposure of the substrate to 10 milliliters of gamma-butyrolactone (BLO) and 200 microliters of fluorosilicic acid in supercritical carbon dioxide for approximately three minutes; (2) exposure of the substrate to 10 milliliters of isopropyl alcohol (IPA) and 200 microliters of fluorosilicic acid in supercritical carbon dioxide for approximately three minutes; and (3) exposure of the substrate to 13 milliliters of 12:1 ratio MeOH:$H_2O$ in supercritical carbon dioxide for approximately three minutes. The first, second, and third steps can be repeated any number of times. Moreover, any step may be repeated. Additionally, the time duration for each step, or sub-step, may be varied greater than or less than those specified. Further yet, the amount of any chemical in the process chemistry may be varied greater than or less than those specified, and the ratios may be varied. Further yet, the temperature or pressure can be varied.

In another example, the process chemistry can comprise a first cleaning composition comprising a mixture of fluorosilicic acid and gamma-butyrolactone (BLO) in supercritical carbon dioxide, and a second cleaning composition comprising a mixture of fluorosilicic acid and isopropyl alcohol (IPA) in supercritical carbon dioxide, and a third cleaning composition comprising 2-butanone peroxide in supercritical carbon dioxide. By way of further example, a process recipe for removing post-etch residue(s) can comprise three steps including: (1) exposure of the substrate to 10 milliliters of gamma-butyrolactone (BLO) and 200 microliters of fluorosilicic acid in supercritical carbon dioxide for approximately three minutes; (2) exposure of the substrate to 10 milliliters of isopropyl alcohol (IPA) and 200 microliters of fluorosilicic acid in supercritical carbon dioxide for approximately three minutes; and (3) exposure of the substrate to 13 milliliters of 2-butanone peroxide in supercritical carbon dioxide for approximately three minutes. The first, second, and third steps can be repeated any number of times, for instance, they may be repeated once. Moreover, any step may be repeated. Additionally, the time duration for each step, or sub-step, may be varied greater than or less than those specified. Further yet, the amount of any chemical in the process chemistry may be varied greater than or less than those specified, and the ratios may be varied. Further yet, the temperature or pressure can be varied.

Additional details regarding high temperature processing are provided in co-pending U.S. patent application Ser. No. 10/987,067, entitled "Method and System For Treating a Substrate Using a Supercritical Fluid," filed on Nov. 12, 2004; the entire content of which is herein incorporated by reference in its entirety.

In yet another embodiment, the processes described herein can be further supplemented by ozone processing. For example, when performing a cleaning process, the substrate can be subjected to ozone treatment prior to by treating with a supercritical processing solution. During ozone treatment, the substrate enters an ozone module, and the surface residues to be removed are exposed to an ozone atmosphere. For instance, a partial pressure of ozone formed in oxygen can be flowed over the surface of the substrate for a period of time sufficient to oxidize residues either partly or wholly. The ozone process gas flow rate can, for example, range from 1 to 50 slm (standard liters per minute) and, by way of further example, the flow rate can range from 5 to 15 slm. Additionally, the pressure can, for example, range from 1 to 5 atm and, by way of further example, range from 1 to 3 atm. Further details are provided in co-pending U.S. patent application Ser. No. 10/987,594, entitled "A Method for Removing a Residue from a Substrate Using Supercritical Carbon Dioxide Processing," filed on Nov. 12, 2004, and co-pending U.S. patent application Ser. No. 10/987,676, entitled "A System for Removing a Residue from a Substrate Using Supercritical Carbon Dioxide Processing," filed on Nov. 12, 2004; the entire contents of which are incorporated herein by reference in their entirety.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of treating a substrate comprising:

placing said substrate having an open metal surface thereon into a high pressure processing chamber and onto a platen configured to support said substrate;

forming a supercritical fluid from a carbon dioxide fluid by adjusting a pressure of said carbon dioxide fluid above the critical pressure of said carbon dioxide fluid, and adjusting a temperature of said carbon dioxide fluid above the critical temperature of said carbon dioxide fluid, wherein said temperature is in the range of approximately 100° C. to approximately 300° C.;

introducing said supercritical carbon dioxide fluid to said high pressure processing chamber;

introducing a first process chemistry comprising fluorosilicic acid and butyrolactone (BLO) to said supercritical carbon dioxide fluid;

exposing said substrate to said supercritical carbon dioxide fluid and said first process chemistry for a first time duration;

thereafter, introducing a second process chemistry comprising fluorosilicic acid and isopropyl alcohol (IPA) to said supercritical carbon dioxide fluid;

exposing said substrate to said supercritical carbon dioxide fluid and said second process chemistry for a second time duration;

thereafter, introducing a third process chemistry comprising a mixture of methanol and water, or 2-butanone peroxide, to said supercritical carbon dioxide fluid;

exposing said substrate to said supercritical carbon dioxide fluid and said third process chemistry for a third time duration.

2. The method of claim 1, further comprising:

repeating said first exposing step, said second exposing step, or said third exposing step one or more times.

3. The method of claim 1, further comprising:

pre-heating said first process chemistry prior to introducing said first process chemistry to said supercritical carbon dioxide fluid;

pre-heating said second process chemistry prior to introducing said second process chemistry to said supercritical carbon dioxide fluid; and pre-heating said third process chemistry prior to introducing said third process chemistry to said supercritical carbon dioxide fluid.

4. The method of claim 1, wherein said adjusting said pressure above said critical pressure includes adjusting said pressure to a pressure in the range of approximately 2000 psi to approximately 10,000 psi.

5. The method of claim 1, further comprising:

exposing said substrate to ozone.

6. The method of claim 5, wherein said exposing said substrate to said ozone precedes said exposing said substrate to said supercritical carbon dioxide fluid and said first process chemistry.

* * * * *

UNITED STATES PATENT AND TRADEMARK OFFICE

CERTIFICATE OF CORRECTION

PATENT NO. : 7,291,565 B2
APPLICATION NO. : 10/906353
DATED : November 6, 2007
INVENTOR(S) : Hansen et al.

It is certified that error appears in the above-identified patent and that said Letters Patent is hereby corrected as shown below:

Col. 3, line 21, “to a one or more” should read --to one or more--.
Col. 7, line 28, “hexamethyidisilazane” should read --hexamethyldisilazane--.
Col. 8, line 60, “to affect” should read --to effect--.
Col. 10, line 7, “coupled to a one or more” should read --coupled to one or more--.
Col. 11, line 3, “forty five (45)” should read --forty-five (45)--.
Col. 11, line 22, “10/018,922” should read --11/018,922--.
Col. 13, lines 4-5, “prior to by treating” should read --prior to treating--.

Signed and Sealed this

Twelfth Day of August, 2008

Jon W. Dudas

JON W. DUDAS
*Director of the United States Patent and Trademark Office*